United States Patent
Bertness

(10) Patent No.: US 10,317,468 B2
(45) Date of Patent: Jun. 11, 2019

(54) ALTERNATOR TESTER

(71) Applicant: Midtronics, Inc., Willowbrook, IL (US)

(72) Inventor: Kevin I. Bertness, Batavia, IL (US)

(73) Assignee: MIDTRONICS, INC., Willowbrook, IL (US)

(*) Notice: Subject to any disclaimer, the term of this patent is extended or adjusted under 35 U.S.C. 154(b) by 361 days.

(21) Appl. No.: 15/006,467

(22) Filed: Jan. 26, 2016

(65) Prior Publication Data

US 2016/0216335 A1     Jul. 28, 2016

Related U.S. Application Data

(60) Provisional application No. 62/107,648, filed on Jan. 26, 2015, provisional application No. 62/161,555, filed on May 14, 2015.

(51) Int. Cl.
  *G01M 15/02* (2006.01)
  *G01R 31/34* (2006.01)
  *G01R 31/00* (2006.01)

(52) U.S. Cl.
  CPC ......... *G01R 31/343* (2013.01); *G01R 31/006* (2013.01); *G01R 31/34* (2013.01)

(58) Field of Classification Search
  USPC .................................................. 73/114.59
  See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |
| 2,254,846 A | 9/1941 | Heyer | 324/437 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |
| 3,025,455 A | 3/1962 | Jonsson | 323/369 |
| 3,178,686 A | 4/1965 | Mills | 340/447 |

(Continued)

FOREIGN PATENT DOCUMENTS

| CN | 2470964 Y | 1/2002 |
|---|---|---|
| CN | 201063352 Y | 5/2008 |

(Continued)

OTHER PUBLICATIONS

Notification of Transmittal of the International Search Report and the Written Opinion from PCT/US2016/014867, dated Jun. 3, 2016.

(Continued)

*Primary Examiner* — Eric S McCall
(74) *Attorney, Agent, or Firm* — Westman, Champlin & Koehler, P.A.

(57) ABSTRACT

An alternator tester is configured to test an alternator of a vehicle, the alternator of the type which electrically couples to the vehicle through an alternator connector. The alternator tester includes alternator test circuitry and an alternator test connector or adapter configured to electrically connect the test circuitry to the alternator connector. A vehicle connector is configured to electrically connect the test circuitry to the vehicle through the alternator connector. The test circuitry is configured to interact with the alternator through the alternator test connector and thereby test operation of the alternator.

22 Claims, 7 Drawing Sheets

(56) References Cited

U.S. PATENT DOCUMENTS

| | | | |
|---|---|---|---|
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,704,439 A | 11/1972 | Nelson | |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,879,654 A | 4/1975 | Kessinger | 324/434 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A * | 2/1976 | Perlmutter | G01R 31/006 324/765.01 |
| 3,939,400 A | 2/1976 | Steele | 324/434 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A * | 1/1978 | Taylor | G01R 31/006 269/217 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,176,315 A | 11/1979 | Sunnarborg | 324/133 |
| 4,178,546 A * | 12/1979 | Hulls | G01R 31/343 322/99 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,295,468 A | 10/1981 | Bartelt | |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 6/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A * | 7/1984 | Lentz | G01R 31/343 324/384 |
| 4,502,000 A | 2/1985 | Mashikian | |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,544,312 A | 10/1985 | Stencel | |
| 4,560,230 A | 12/1985 | Inglis | 439/890 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,643,511 A | 2/1987 | Gawlik | 439/755 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,826,457 A | 5/1989 | Varatta | 439/504 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |

(56) References Cited

U.S. PATENT DOCUMENTS

| | | | |
|---|---|---|---|
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,335 A | 8/1991 | Campbell | 439/217 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,083,076 A | 1/1992 | Scott | 320/105 |
| 5,087,881 A * | 2/1992 | Peacock | G01R 21/133 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,167,529 A | 12/1992 | Verge | 427/1 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | 307/10.1 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,296,823 A | 3/1994 | Dietrich | 333/161 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A | 5/1994 | Kim | 74/350 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A | 10/1995 | Keith | 180/279 |
| 5,469,043 A | 11/1995 | Cherng et al. | 320/161 |
| 5,485,090 A | 1/1996 | Stephens | 324/433 |
| 5,486,123 A | 1/1996 | Miyazaki | 439/825 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A * | 8/1996 | Falk | G01R 31/343 322/99 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A * | 12/1997 | Perkins | G01R 31/31707 322/99 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |

(56) References Cited

U.S. PATENT DOCUMENTS

| | | | |
|---|---|---|---|
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 20/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,826,467 A | 10/1998 | Huang | |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,870,018 A | 2/1999 | Person | 307/10.2 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,884,202 A | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,037,749 A | 4/2000 | Parsonage | 320/132 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,081,154 A | 6/2000 | Ezell et al. | 327/540 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,121,880 A | 9/2000 | Scott et al. | 340/572.5 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,149,653 A | 11/2000 | Deslauriers | 606/232 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,655 B1 | 2/2001 | Malackowski | 320/116 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,242,921 B1 | 6/2001 | Thibedeau et al. | 324/429 |
| 6,249,124 B1 | 6/2001 | Bertness | 324/426 |
| 6,250,973 B1 | 6/2001 | Lowery et al. | 439/763 |
| 6,252,942 B1 | 6/2001 | Zoiss | 379/19 |
| 6,254,438 B1 | 7/2001 | Gaunt | 439/755 |
| 6,255,826 B1 | 7/2001 | Ohsawa | 320/116 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |

(56) References Cited

U.S. PATENT DOCUMENTS

| | | |
|---|---|---|
| 6,294,896 B1 | 9/2001 | Champlin ............... 320/134 |
| 6,294,897 B1 | 9/2001 | Champlin ............... 320/153 |
| 6,304,087 B1 | 10/2001 | Bertness ............... 324/426 |
| 6,307,349 B1 | 10/2001 | Koenck et al. ............ 320/112 |
| 6,310,481 B2 | 10/2001 | Bertness ............... 324/430 |
| 6,313,607 B1 | 11/2001 | Champlin ............... 320/132 |
| 6,313,608 B1 | 11/2001 | Varghese et al. .......... 320/132 |
| 6,316,914 B1 | 11/2001 | Bertness ............... 320/134 |
| 6,320,385 B1 | 11/2001 | Ng et al. ............... 320/104 |
| 6,323,650 B1 | 11/2001 | Bertness et al. .......... 324/426 |
| 6,324,042 B1 | 11/2001 | Andrews ............... 361/93.2 |
| 6,329,793 B1 | 12/2001 | Bertness et al. .......... 320/132 |
| 6,331,762 B1 | 12/2001 | Bertness ............... 320/134 |
| 6,332,113 B1 | 12/2001 | Bertness ................ 702/63 |
| 6,346,795 B2 | 2/2002 | Haraguchi et al. ........ 320/136 |
| 6,347,958 B1 | 2/2002 | Tsai ................... 439/488 |
| 6,351,102 B1 | 2/2002 | Troy .................. 320/139 |
| 6,356,042 B1 | 3/2002 | Kahlon et al. ........... 318/138 |
| 6,356,083 B1 | 3/2002 | Ying .................. 324/426 |
| 6,359,441 B1 | 3/2002 | Bertness ............... 324/426 |
| 6,359,442 B1 | 3/2002 | Henningson et al. ....... 324/426 |
| 6,363,303 B1 * | 3/2002 | Bertness ............ H02J 7/1461 |
| | | 320/150 |
| RE37,677 E | 4/2002 | Irie ................... 315/83 |
| 6,377,031 B1 | 4/2002 | Karuppana et al. ........ 323/220 |
| 6,384,608 B1 | 5/2002 | Namaky ............... 324/430 |
| 6,388,448 B1 | 5/2002 | Cervas ................ 324/426 |
| 6,389,337 B1 | 5/2002 | Kolls .................. 701/31.6 |
| 6,392,414 B2 | 5/2002 | Bertness ............... 324/429 |
| 6,396,278 B1 | 5/2002 | Makhija ............... 324/402 |
| 6,407,554 B1 | 6/2002 | Godau et al. ........... 324/503 |
| 6,411,098 B1 | 6/2002 | Laletin ................ 324/436 |
| 6,417,669 B1 | 7/2002 | Champlin ............... 324/426 |
| 6,420,852 B1 | 7/2002 | Sato .................. 320/134 |
| 6,424,157 B1 | 7/2002 | Gollomp et al. .......... 324/430 |
| 6,424,158 B2 | 7/2002 | Klang ................. 324/433 |
| 6,433,512 B1 | 8/2002 | Birkler et al. ........... 320/132 |
| 6,437,957 B1 | 8/2002 | Karuppana et al. ........ 361/78 |
| 6,441,585 B1 | 8/2002 | Bertness ............... 320/132 |
| 6,445,158 B1 | 9/2002 | Bertness et al. .......... 320/104 |
| 6,448,778 B1 | 9/2002 | Rankin ................ 324/503 |
| 6,449,726 B1 | 9/2002 | Smith ................. 713/340 |
| 6,456,036 B1 | 9/2002 | Thandiwe ............. 320/106 |
| 6,456,045 B1 | 9/2002 | Troy et al. ............. 320/139 |
| 6,465,908 B1 | 10/2002 | Karuppana et al. ........ 307/31 |
| 6,466,025 B1 * | 10/2002 | Klang .............. G01R 31/34 |
| | | 324/426 |
| 6,466,026 B1 | 10/2002 | Champlin ............... 324/430 |
| 6,469,511 B1 | 10/2002 | Vonderhaar et al. ....... 324/425 |
| 6,473,659 B1 | 10/2002 | Shah et al. ............. 700/79 |
| 6,477,478 B1 | 11/2002 | Jones et al. ............ 702/102 |
| 6,495,990 B2 | 12/2002 | Champlin ............... 320/132 |
| 6,497,209 B1 | 12/2002 | Karuppana et al. ....... 123/179.3 |
| 6,500,025 B1 | 12/2002 | Moenkhaus et al. ....... 439/502 |
| 6,501,243 B1 | 12/2002 | Kaneko ............... 318/139 |
| 6,505,507 B1 | 1/2003 | Imao .................. 73/146.5 |
| 6,507,196 B2 | 1/2003 | Thomsen et al. .......... 324/436 |
| 6,526,361 B1 | 2/2003 | Jones et al. ............ 702/63 |
| 6,529,723 B1 | 3/2003 | Bentley ................ 455/405 |
| 6,531,848 B1 | 3/2003 | Chitsazan et al. ........ 320/153 |
| 6,532,425 B1 | 3/2003 | Boost et al. ............ 702/63 |
| 6,533,316 B2 | 3/2003 | Breed et al. ............ 280/735 |
| 6,534,992 B2 | 3/2003 | Meissner et al. .......... 324/426 |
| 6,534,993 B2 | 3/2003 | Bertness ............... 324/433 |
| 6,536,536 B1 | 3/2003 | Gass et al. ............. 173/2 |
| 6,544,078 B2 | 4/2003 | Palmisano et al. ........ 439/762 |
| 6,545,599 B2 | 4/2003 | Derbyshire et al. ....... 340/442 |
| 6,556,019 B2 | 4/2003 | Bertness ............... 324/426 |
| 6,566,883 B1 | 5/2003 | Vonderhaar et al. ....... 324/426 |
| 6,570,385 B1 | 5/2003 | Roberts et al. ........... 324/378 |
| 6,577,107 B2 | 6/2003 | Kechmire .............. 320/139 |
| 6,586,941 B2 | 7/2003 | Bertness et al. .......... 324/426 |
| 6,597,150 B1 | 7/2003 | Bertness et al. .......... 320/104 |
| 6,599,243 B2 | 7/2003 | Woltermann et al. ....... 600/300 |
| 6,600,815 B1 | 7/2003 | Walding ............... 379/93.07 |
| 6,611,740 B2 | 8/2003 | Lowrey et al. ........... 701/29 |
| 6,614,349 B1 | 9/2003 | Proctor et al. ........... 340/572.1 |
| 6,618,644 B2 | 9/2003 | Bean .................. 700/231 |
| 6,621,272 B2 | 9/2003 | Champlin ............... 324/426 |
| 6,623,314 B1 | 9/2003 | Cox et al. .............. 439/759 |
| 6,624,635 B1 | 9/2003 | Lui ................... 324/426 |
| 6,628,011 B2 | 9/2003 | Droppo et al. ........... 307/43 |
| 6,629,054 B2 | 9/2003 | Makhija et al. .......... 702/113 |
| 6,633,165 B2 | 10/2003 | Bertness ............... 324/426 |
| 6,635,974 B1 | 10/2003 | Karuppana et al. ........ 307/140 |
| 6,636,790 B1 | 10/2003 | Lightner et al. .......... 701/31.5 |
| 6,667,624 B1 | 12/2003 | Raichle et al. ........... 324/522 |
| 6,679,212 B2 | 1/2004 | Kelling ................ 123/179.28 |
| 6,686,542 B2 | 2/2004 | Zhang ................. 174/74 |
| 6,696,819 B2 | 2/2004 | Bertness ............... 320/134 |
| 6,707,303 B2 | 3/2004 | Bertness et al. .......... 324/426 |
| 6,732,031 B1 | 5/2004 | Lightner et al. .......... 701/31.4 |
| 6,736,941 B2 | 5/2004 | Oku et al. .............. 203/68 |
| 6,737,831 B2 | 5/2004 | Champlin ............... 320/132 |
| 6,738,697 B2 | 5/2004 | Breed ................. 701/29 |
| 6,740,990 B2 | 5/2004 | Tozuka et al. ........... 307/9.1 |
| 6,744,149 B1 | 6/2004 | Karuppana et al. ........ 307/31 |
| 6,745,153 B2 | 6/2004 | White et al. ............ 702/184 |
| 6,759,849 B2 | 7/2004 | Bertness ............... 324/426 |
| 6,771,073 B2 | 8/2004 | Henningson et al. ....... 324/426 |
| 6,777,945 B2 | 8/2004 | Roberts et al. ........... 324/426 |
| 6,781,344 B1 | 8/2004 | Hedegor et al. .......... 320/106 |
| 6,781,382 B2 | 8/2004 | Johnson ............... 324/426 |
| 6,784,635 B2 | 8/2004 | Larson ................ 320/104 |
| 6,784,637 B2 | 8/2004 | Raichle et al. ........... 320/107 |
| 6,788,025 B2 | 9/2004 | Bertness et al. .......... 320/104 |
| 6,795,782 B2 | 9/2004 | Bertness et al. .......... 702/63 |
| 6,796,841 B1 | 9/2004 | Cheng et al. ............ 439/620.3 |
| 6,805,090 B2 | 10/2004 | Bertness et al. .......... 123/198 |
| 6,806,716 B2 | 10/2004 | Bertness et al. .......... 324/426 |
| 6,825,669 B2 | 11/2004 | Raichle et al. ........... 324/426 |
| 6,832,141 B2 | 12/2004 | Skeen et al. ............ 701/31.4 |
| 6,842,707 B2 | 1/2005 | Raichle et al. ........... 702/62 |
| 6,845,279 B1 | 1/2005 | Gilmore et al. .......... 700/115 |
| 6,850,037 B2 | 2/2005 | Bertness ............... 320/132 |
| 6,856,162 B1 | 2/2005 | Greatorex et al. ........ 324/764.01 |
| 6,856,972 B1 | 2/2005 | Yun et al. .............. 705/36 R |
| 6,871,151 B2 | 3/2005 | Bertness ............... 702/63 |
| 6,885,195 B2 | 4/2005 | Bertness ............... 324/426 |
| 6,888,468 B2 | 5/2005 | Bertness ............... 340/636.15 |
| 6,891,378 B2 | 5/2005 | Bertness et al. .......... 324/426 |
| 6,895,809 B2 | 5/2005 | Raichle ................ 73/119 |
| 6,904,796 B2 | 6/2005 | Pacsai et al. ............ 73/146.8 |
| 6,906,522 B2 | 6/2005 | Bertness et al. .......... 324/426 |
| 6,906,523 B2 | 6/2005 | Bertness et al. .......... 324/426 |
| 6,906,624 B2 | 6/2005 | McClelland et al. ....... 340/442 |
| 6,909,287 B2 | 6/2005 | Bertness ............... 324/427 |
| 6,909,356 B2 | 6/2005 | Brown et al. ............ 340/3.2 |
| 6,911,825 B2 | 6/2005 | Namaky ............... 324/426 |
| 6,913,483 B2 | 7/2005 | Restaino et al. .......... 439/504 |
| 6,914,413 B2 | 7/2005 | Bertness et al. .......... 320/104 |
| 6,919,725 B2 | 7/2005 | Bertness et al. .......... 324/433 |
| 6,930,485 B2 | 8/2005 | Bertness et al. .......... 324/426 |
| 6,933,727 B2 | 8/2005 | Bertness et al. .......... 324/426 |
| 6,941,234 B2 | 9/2005 | Bertness et al. .......... 702/63 |
| 6,957,133 B1 | 10/2005 | Hunt et al. ............. 701/32.4 |
| 6,966,676 B2 | 11/2005 | Chabert et al. |
| 6,967,484 B2 | 11/2005 | Bertness ............... 324/426 |
| 6,972,662 B1 | 12/2005 | Ohkawa et al. .......... 340/10.1 |
| 6,983,212 B2 | 1/2006 | Burns ................. 702/63 |
| 6,988,053 B2 | 1/2006 | Namaky ............... 320/104 |
| 6,993,421 B2 | 1/2006 | Pillar et al. ............ 701/29.4 |
| 6,998,847 B2 | 2/2006 | Bertness et al. .......... 324/426 |
| 7,003,410 B2 | 2/2006 | Bertness et al. .......... 702/63 |
| 7,003,411 B2 | 2/2006 | Bertness ............... 702/63 |
| 7,012,433 B2 | 3/2006 | Smith et al. ............ 324/426 |
| 7,015,674 B2 | 3/2006 | VonderHaar |
| 7,029,338 B1 | 4/2006 | Orange et al. ........... 439/755 |
| 7,034,541 B2 | 4/2006 | Bertness et al. .......... 324/426 |
| 7,039,533 B2 | 5/2006 | Bertness et al. .......... 702/63 |
| 7,042,346 B2 | 5/2006 | Paulsen ............... 340/438 |
| 7,049,822 B2 | 5/2006 | Kung ................. 324/426 |
| 7,058,525 B2 | 6/2006 | Bertness et al. .......... 702/63 |
| 7,069,979 B2 | 7/2006 | Tobias ................ 165/104.33 |

(56) References Cited

U.S. PATENT DOCUMENTS

| | | | |
|---|---|---|---|
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,173,182 B2 | 2/2007 | Katsuyama | 174/36 |
| 7,177,925 B2 | 2/2007 | Carcido et al. | 709/223 |
| 7,182,147 B2 | 2/2007 | Cutler et al. | 173/1 |
| 7,184,866 B2 | 2/2007 | Squires | 340/426.15 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al. | 700/276 |
| 7,212,911 B2 | 5/2007 | Raichle et al. | 701/114 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,251,551 B2 | 7/2007 | Mitsueda | 700/2 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,301,303 B1 | 11/2007 | Hulden | 320/103 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,376,497 B2 | 5/2008 | Chen | 701/31.6 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,538,571 B2 | 5/2009 | Raichle et al. | 324/772 |
| 7,545,146 B2 | 6/2009 | Klang et al. | 324/426 |
| 7,557,586 B1 | 7/2009 | Vonderhaar et al. | 324/437 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 320/116 |
| 7,684,908 B1 | 3/2010 | Ogilvie et al. | 701/29.6 |
| 7,688,074 B2 | 3/2010 | Cox et al. | 324/426 |
| 7,690,573 B2 | 4/2010 | Raichle et al. | 235/462 |
| 7,696,759 B2 | 4/2010 | Raichle et al. | 324/538 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,706,992 B2 | 4/2010 | Ricci et al. | |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,729,880 B1 | 6/2010 | Mashburn | 702/151 |
| 7,743,788 B2 | 6/2010 | Schmitt | 137/554 |
| 7,751,953 B2 | 7/2010 | Namaky | 701/33.2 |
| 7,772,850 B2 | 8/2010 | Bertness | 324/426 |
| 7,774,130 B2 | 8/2010 | Pepper | 340/439 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,914,350 B1 | 3/2011 | Bozich | 439/506 |
| 7,924,015 B2 | 4/2011 | Bertness | |
| 7,940,052 B2 | 5/2011 | Vonderhaar | |
| 7,940,053 B2 | 5/2011 | Brown et al. | 324/426 |
| 7,959,476 B2 | 6/2011 | Smith et al. | |
| 7,977,914 B2 | 7/2011 | Bertness | |
| D643,759 S | 8/2011 | Bertness | |
| 7,990,155 B2 | 8/2011 | Henningson | 324/429 |
| 7,999,505 B2 | 8/2011 | Bertness | 320/104 |
| 8,024,083 B2 | 9/2011 | Chenn | 701/2 |
| 8,047,868 B1 | 11/2011 | Korcynski | 439/522 |
| 8,164,343 B2 | 4/2012 | Bertness | 324/503 |
| 8,198,900 B2 | 6/2012 | Bertness et al. | |
| 8,203,345 B2 | 6/2012 | Bertness | |
| 8,222,868 B2 | 7/2012 | Buckner | 320/136 |
| 8,226,008 B2 | 7/2012 | Raichle et al. | 235/462.13 |
| 8,237,448 B2 | 8/2012 | Bertness | |
| 8,306,690 B2 | 11/2012 | Bertness | 701/34.4 |
| 8,310,271 B2 | 11/2012 | Raichle et al. | 324/765.01 |
| 8,344,685 B2 | 1/2013 | Bertness et al. | |
| 8,436,619 B2 | 5/2013 | Bertness et al. | |
| 8,442,877 B2 | 5/2013 | Bertness et al. | |
| 8,449,560 B2 | 5/2013 | Roth | 227/175.1 |
| 8,493,022 B2 | 7/2013 | Bertness | |
| D687,727 S | 8/2013 | Kehoe et al. | |
| 8,509,212 B2 | 8/2013 | Sanjeev | |
| 8,513,949 B2 | 8/2013 | Bertness | |
| 8,594,957 B2 | 11/2013 | Gauthier | 324/548 |
| 8,674,654 B2 | 3/2014 | Bertness | |
| 8,674,711 B2 | 3/2014 | Bertness | |
| 8,704,483 B2 | 4/2014 | Bertness et al. | |
| 8,738,309 B2 | 5/2014 | Bertness | |
| 8,754,653 B2 | 6/2014 | Volderhaar et al. | |
| 8,825,272 B1* | 9/2014 | Chinnadurai | G01R 31/34 180/65.285 |
| 8,827,729 B2 | 9/2014 | Gunreben | 439/188 |
| 8,872,516 B2 | 10/2014 | Bertness | |
| 8,872,517 B2 | 10/2014 | Philbrook et al. | |
| 8,958,998 B2 | 2/2015 | Bertness | |
| 8,963,550 B2 | 2/2015 | Bertness et al. | |
| 9,018,958 B2 | 4/2015 | Bertness | |
| 9,037,394 B2 | 5/2015 | Fernandes | 701/400 |
| 9,052,366 B2 | 6/2015 | Bertness | |
| 9,201,120 B2 | 12/2015 | Stukenburg | |
| 9,229,062 B2 | 1/2016 | Stukenberg | |
| 9,244,100 B2 | 1/2016 | Coleman et al. | |
| 9,255,955 B2 | 2/2016 | Bertness | 324/503 |
| 9,274,157 B2 | 3/2016 | Bertness | |
| 9,312,575 B2 | 4/2016 | Stukenberg | |
| 9,335,362 B2 | 5/2016 | Bertness | |
| 9,419,311 B2 | 8/2016 | Bertness | |
| 9,425,487 B2 | 8/2016 | Bertness | |
| 9,496,720 B2 | 11/2016 | McShane | |
| 9,588,185 B2 | 3/2017 | Champlin | |
| 9,639,899 B1 | 5/2017 | Gersitz | |
| 9,923,289 B2 | 3/2018 | Bertness | |
| 9,966,676 B2 | 5/2018 | Salo, III et al. | |
| 10,046,649 B2 | 8/2018 | Bertness | |
| 2001/0012738 A1 | 8/2001 | Duperret | 439/835 |
| 2001/0033169 A1 | 10/2001 | Singh | 324/426 |
| 2001/0035737 A1 | 11/2001 | Nakanishi et al. | 320/122 |
| 2001/0048215 A1 | 12/2001 | Breed et al. | 280/728.1 |
| 2001/0048226 A1 | 12/2001 | Nada | 290/40 |
| 2002/0003423 A1 | 1/2002 | Bertness et al. | 324/426 |
| 2002/0004694 A1 | 1/2002 | McLeod | 701/29 |
| 2002/0007237 A1 | 1/2002 | Phung et al. | 701/33 |
| 2002/0010558 A1 | 1/2002 | Bertness et al. | |

(56) References Cited

U.S. PATENT DOCUMENTS

| | | | |
|---|---|---|---|
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0036504 A1 | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | |
| 2002/0050163 A1 | 5/2002 | Makhija et al. | 73/116 |
| 2002/0065619 A1 | 5/2002 | Bertness et al. | |
| 2002/0074398 A1 | 6/2002 | Lancos et al. | 235/382 |
| 2002/0116140 A1 | 8/2002 | Rider | 702/63 |
| 2002/0118111 A1 | 8/2002 | Brown et al. | 340/573.1 |
| 2002/0121901 A1 | 9/2002 | Hoffman | 324/426 |
| 2002/0128985 A1 | 9/2002 | Greenwald | 705/400 |
| 2002/0130665 A1 | 9/2002 | Bertness et al. | 324/426 |
| 2002/0153864 A1 | 10/2002 | Bertness | 320/132 |
| 2002/0171428 A1 | 11/2002 | Bertness | 702/63 |
| 2002/0176010 A1 | 11/2002 | Wallach et al. | 348/362 |
| 2002/0193955 A1 | 12/2002 | Bertness | 702/63 |
| 2003/0006779 A1 | 1/2003 | Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0030442 A1 | 2/2003 | Sugimoto | 324/429 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | |
| 2003/0090272 A1 | 5/2003 | Bertness | 324/426 |
| 2003/0114206 A1 | 6/2003 | Timothy | 455/575.7 |
| 2003/0124417 A1 | 7/2003 | Bertness et al. | 429/90 |
| 2003/0128011 A1 | 7/2003 | Bertness et al. | |
| 2003/0128036 A1 | 7/2003 | Henningson et al. | 324/426 |
| 2003/0137277 A1 | 7/2003 | Mori et al. | 320/132 |
| 2003/0155930 A1 | 8/2003 | Thomsen | |
| 2003/0164073 A1 | 9/2003 | Chen | |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0173971 A1 | 9/2003 | Bertness | 324/441 |
| 2003/0177417 A1 | 9/2003 | Malhotra et al. | 714/42 |
| 2003/0184262 A1 | 10/2003 | Makhija | 320/156 |
| 2003/0184264 A1 | 10/2003 | Bertness | |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0224241 A1 | 12/2003 | Takada et al. | 429/52 |
| 2003/0236656 A1 | 12/2003 | Dougherty | 703/14 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0046564 A1 | 3/2004 | Klang | 324/426 |
| 2004/0049361 A1* | 3/2004 | Hamdan | G01R 31/007 702/115 |
| 2004/0051532 A1 | 3/2004 | Smith et al. | 324/426 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/182 |
| 2004/0064225 A1 | 4/2004 | Jammu et al. | 701/29 |
| 2004/0065489 A1 | 4/2004 | Aberle | 180/65.1 |
| 2004/0088087 A1 | 5/2004 | Fukushima et al. | 701/32 |
| 2004/0104728 A1* | 6/2004 | Bertness | G01R 31/007 324/429 |
| 2004/0108855 A1* | 6/2004 | Raichle | G01R 31/34 324/378 |
| 2004/0108856 A1 | 6/2004 | Johnson | 324/426 |
| 2004/0113494 A1 | 6/2004 | Karuppana et al. | |
| 2004/0113588 A1 | 6/2004 | Mikuriya et al. | 320/128 |
| 2004/0145342 A1 | 7/2004 | Lyon | 320/108 |
| 2004/0145371 A1 | 7/2004 | Bertness | 324/426 |
| 2004/0150494 A1 | 8/2004 | Yoshida | 333/243 |
| 2004/0157113 A1 | 8/2004 | Klang | 429/50 |
| 2004/0164706 A1 | 8/2004 | Osborne | 320/116 |
| 2004/0172177 A1 | 9/2004 | Nagai et al. | 701/29 |
| 2004/0178185 A1 | 9/2004 | Yoshikawa et al. | 219/270 |
| 2004/0189309 A1 | 9/2004 | Bertness et al. | 324/426 |
| 2004/0199343 A1 | 10/2004 | Cardinal et al. | 702/63 |
| 2004/0207367 A1 | 10/2004 | Taniguchi et al. | 320/149 |
| 2004/0221641 A1 | 11/2004 | Moritsugu | 73/23.31 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness et al. | 320/136 |
| 2004/0257084 A1 | 12/2004 | Restaino | 324/400 |
| 2005/0007068 A1 | 1/2005 | Johnson et al. | 320/110 |
| 2005/0009122 A1 | 1/2005 | Whelan et al. | 435/7.32 |
| 2005/0017726 A1 | 1/2005 | Koran et al. | 324/433 |
| 2005/0017952 A1 | 1/2005 | His | 345/169 |
| 2005/0021197 A1 | 1/2005 | Zimmerman | 701/31.4 |
| 2005/0021294 A1 | 1/2005 | Trsar et al. | 702/183 |
| 2005/0021475 A1 | 1/2005 | Bertness | 705/63 |
| 2005/0025299 A1 | 2/2005 | Tischer et al. | 379/199 |
| 2005/0035752 A1* | 2/2005 | Bertness | G01R 31/007 324/120 |
| 2005/0043868 A1 | 2/2005 | Mitcham | 701/29 |
| 2005/0057256 A1 | 3/2005 | Bertness | 324/426 |
| 2005/0060070 A1 | 3/2005 | Kapolka et al. | 701/29 |
| 2005/0073314 A1 | 4/2005 | Bertness et al. | 324/433 |
| 2005/0076381 A1 | 4/2005 | Gross | 725/107 |
| 2005/0077904 A1 | 4/2005 | Bertness | |
| 2005/0096809 A1 | 5/2005 | Skeen et al. | 701/29 |
| 2005/0102073 A1 | 5/2005 | Ingram | 701/29 |
| 2005/0119809 A1 | 6/2005 | Chen | 701/33.5 |
| 2005/0128083 A1 | 6/2005 | Puzio et al. | 340/572.1 |
| 2005/0128902 A1 | 6/2005 | Tsai | 369/44.32 |
| 2005/0133245 A1 | 6/2005 | Katsuyama | 174/74 R |
| 2005/0134282 A1 | 6/2005 | Averbuch | 324/426 |
| 2005/0143882 A1 | 6/2005 | Umezawa | 701/29 |
| 2005/0159847 A1 | 7/2005 | Shah et al. | 700/276 |
| 2005/0162172 A1 | 7/2005 | Bertness | 324/426 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0184732 A1 | 8/2005 | Restaino | 324/426 |
| 2005/0206346 A1 | 9/2005 | Smith et al. | |
| 2005/0212521 A1 | 9/2005 | Bertness et al. | 324/426 |
| 2005/0213874 A1 | 9/2005 | Kline | 385/15 |
| 2005/0218902 A1 | 10/2005 | Restaino et al. | 324/433 |
| 2005/0231205 A1 | 10/2005 | Bertness et al. | 324/426 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2005/0264296 A1 | 12/2005 | Philbrook | 324/433 |
| 2005/0269880 A1 | 12/2005 | Konishi | 307/10.7 |
| 2005/0273218 A1 | 12/2005 | Breed | 701/2 |
| 2006/0012330 A1 | 1/2006 | Okumura et al. | 320/103 |
| 2006/0017447 A1 | 1/2006 | Bertness | 324/538 |
| 2006/0026017 A1 | 2/2006 | Walkder | 701/31.4 |
| 2006/0030980 A1 | 2/2006 | St. Denis | 701/29 |
| 2006/0038572 A1 | 2/2006 | Philbrook | |
| 2006/0043976 A1 | 3/2006 | Gervais | 324/508 |
| 2006/0061469 A1 | 3/2006 | Jaeger | 340/539.13 |
| 2006/0076923 A1 | 4/2006 | Eaves | 320/112 |
| 2006/0079203 A1 | 4/2006 | Nicolini | 455/411 |
| 2006/0089767 A1 | 4/2006 | Sowa | 701/29 |
| 2006/0090554 A1* | 5/2006 | Krampitz | G01M 15/02 73/116.04 |
| 2006/0090555 A1* | 5/2006 | Krampitz | G01M 15/02 73/116.04 |
| 2006/0091597 A1* | 5/2006 | Opsahl | B25B 11/02 269/45 |

(56) References Cited

U.S. PATENT DOCUMENTS

| | | | |
|---|---|---|---|
| 2006/0092584 A1* | 5/2006 | Raichle | H02H 3/023 361/20 |
| 2006/0095230 A1 | 5/2006 | Grier et al. | 702/183 |
| 2006/0102397 A1 | 5/2006 | Buck | 429/432 |
| 2006/0136119 A1* | 6/2006 | Raichle | F02N 11/10 701/114 |
| 2006/0139167 A1 | 6/2006 | Davie | |
| 2006/0152224 A1 | 7/2006 | Kim et al. | 324/430 |
| 2006/0155439 A1 | 7/2006 | Slawinski | 701/33.4 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0244457 A1 | 11/2006 | Henningson et al. | 324/426 |
| 2006/0282227 A1 | 12/2006 | Bertness | |
| 2006/0282323 A1 | 12/2006 | Walker et al. | 705/14 |
| 2007/0005201 A1 | 1/2007 | Chenn | 701/31.5 |
| 2007/0024460 A1 | 2/2007 | Clark | 340/663 |
| 2007/0026916 A1 | 2/2007 | Juds et al. | 463/1 |
| 2007/0046261 A1 | 3/2007 | Porebski | 320/132 |
| 2007/0082652 A1 | 4/2007 | Hartigan | |
| 2007/0088472 A1 | 4/2007 | Ganzhorn et al. | 701/33 |
| 2007/0108942 A1 | 5/2007 | Johnson et al. | 320/112 |
| 2007/0159177 A1 | 7/2007 | Bertness et al. | 324/426 |
| 2007/0182576 A1 | 8/2007 | Proska et al. | 340/636.1 |
| 2007/0194791 A1 | 8/2007 | Huang | 324/430 |
| 2007/0194793 A1 | 8/2007 | Bertness | 324/503 |
| 2007/0205752 A1 | 9/2007 | Leigh | 324/500 |
| 2007/0205983 A1 | 9/2007 | Naimo | 345/160 |
| 2007/0210801 A1 | 9/2007 | Krampitz | 324/426 |
| 2007/0244660 A1* | 10/2007 | Bertness | G01R 31/007 702/108 |
| 2007/0259256 A1 | 11/2007 | Le Canut et al. | 429/90 |
| 2007/0279066 A1 | 12/2007 | Chism | 324/437 |
| 2008/0023547 A1* | 1/2008 | Raichle | G01R 31/34 235/462.13 |
| 2008/0036421 A1 | 2/2008 | Seo | 320/132 |
| 2008/0053716 A1 | 3/2008 | Scheucher | 180/2.1 |
| 2008/0059014 A1 | 3/2008 | Nasr et al. | 701/22 |
| 2008/0064559 A1 | 3/2008 | Cawthorne | 477/5 |
| 2008/0086246 A1 | 4/2008 | Bolt et al. | 701/29 |
| 2008/0094068 A1 | 4/2008 | Scott | 324/426 |
| 2008/0103656 A1 | 5/2008 | Lipscomb | 701/33.4 |
| 2008/0106267 A1 | 5/2008 | Bertness | 320/112 |
| 2008/0169818 A1 | 7/2008 | Lesesky et al. | 324/426 |
| 2008/0179122 A1 | 7/2008 | Sugawara | 180/65.245 |
| 2008/0194984 A1 | 8/2008 | Keefe | 600/559 |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0011327 A1 | 1/2009 | Okumura et al. | 429/99 |
| 2009/0013521 A1 | 1/2009 | Okumura et al. | 29/730 |
| 2009/0024266 A1 | 1/2009 | Bertness | 701/22 |
| 2009/0024419 A1 | 1/2009 | McClellan | 705/4 |
| 2009/0085571 A1 | 4/2009 | Bertness | 324/426 |
| 2009/0146800 A1 | 6/2009 | Grimlund et al. | 340/505 |
| 2009/0160395 A1 | 6/2009 | Chen | 320/101 |
| 2009/0198372 A1 | 8/2009 | Hammerslag | 700/226 |
| 2009/0203247 A1 | 8/2009 | Fifelski | 439/345 |
| 2009/0237029 A1 | 9/2009 | Andelfinger | 320/108 |
| 2009/0237086 A1 | 9/2009 | Andelfinger | 324/431 |
| 2009/0247020 A1 | 10/2009 | Gathman et al. | 439/759 |
| 2009/0259432 A1 | 10/2009 | Liberty | 702/150 |
| 2009/0265121 A1 | 10/2009 | Rocci | 702/57 |
| 2009/0276115 A1 | 11/2009 | Chen | 701/32 |
| 2009/0311919 A1 | 12/2009 | Smith | 439/502 |
| 2010/0023198 A1 | 1/2010 | Hamilton | 701/29 |
| 2010/0039065 A1 | 2/2010 | Kinkade | 320/104 |
| 2010/0052193 A1 | 3/2010 | Sylvester | 261/26 |
| 2010/0066283 A1 | 3/2010 | Kitanaka | 318/400.02 |
| 2010/0088050 A1 | 4/2010 | Keuss | 702/63 |
| 2010/0117603 A1 | 5/2010 | Makhija | 320/162 |
| 2010/0145780 A1 | 6/2010 | Nishikawa et al. | 705/14.11 |
| 2010/0214055 A1 | 8/2010 | Fuji | 340/3.1 |
| 2010/0265131 A1 | 10/2010 | Fabius | |
| 2010/0314950 A1 | 12/2010 | Rutkowski et al. | 307/125 |
| 2011/0004427 A1 | 1/2011 | Gorbold et al. | 702/63 |
| 2011/0015815 A1 | 1/2011 | Bertness | 701/22 |
| 2011/0106280 A1 | 5/2011 | Zeier | 700/90 |
| 2011/0161025 A1 | 6/2011 | Tomura | 702/63 |
| 2011/0215767 A1 | 9/2011 | Johnson et al. | 320/136 |
| 2011/0218747 A1 | 9/2011 | Bertness | 702/63 |
| 2011/0265025 A1* | 10/2011 | Bertness | G01R 31/006 715/771 |
| 2011/0267067 A1 | 11/2011 | Bertness et al. | |
| 2011/0273181 A1 | 11/2011 | Park et al. | 324/429 |
| 2011/0294367 A1 | 12/2011 | Moon | 439/878 |
| 2011/0300416 A1 | 12/2011 | Bertness | |
| 2012/0041697 A1 | 2/2012 | Stukenberg | 702/63 |
| 2012/0046807 A1 | 2/2012 | Ruther | 701/2 |
| 2012/0046824 A1 | 2/2012 | Ruther et al. | 701/31.5 |
| 2012/0062237 A1 | 3/2012 | Robinson | 324/433 |
| 2012/0074904 A1 | 3/2012 | Rutkowski et al. | 320/112 |
| 2012/0086399 A1 | 4/2012 | Choi | |
| 2012/0116391 A1 | 5/2012 | Houser | 606/41 |
| 2012/0182132 A1 | 7/2012 | McShane | |
| 2012/0249069 A1 | 10/2012 | Ohtomo | 320/109 |
| 2012/0256494 A1 | 10/2012 | Kesler | 307/104 |
| 2012/0256568 A1 | 10/2012 | Lee | 318/139 |
| 2012/0274331 A1 | 11/2012 | Liu | 324/426 |
| 2012/0293372 A1 | 11/2012 | Amendolare | 342/451 |
| 2013/0099747 A1 | 4/2013 | Baba | 310/118 |
| 2013/0115821 A1 | 5/2013 | Golko | 439/638 |
| 2013/0158782 A1 | 6/2013 | Bertness et al. | 701/34.4 |
| 2013/0172019 A1 | 7/2013 | Youssef | 455/456.6 |
| 2013/0218781 A1* | 8/2013 | Simon | G06Q 10/20 705/302 |
| 2013/0288706 A1 | 10/2013 | Yu | 455/456.1 |
| 2013/0297247 A1* | 11/2013 | Jardine | G01R 31/34 702/113 |
| 2013/0311124 A1 | 11/2013 | Van Bremen | |
| 2013/0314041 A1 | 11/2013 | Proebstle | 320/109 |
| 2013/0325405 A1* | 12/2013 | Miller | G06F 15/00 702/183 |
| 2014/0002021 A1 | 1/2014 | Bertness | |
| 2014/0002094 A1 | 1/2014 | Champlin | 324/426 |
| 2014/0029308 A1 | 1/2014 | Cojocaru | 363/13 |
| 2014/0081527 A1* | 3/2014 | Miller | G01M 17/00 701/48 |
| 2014/0099830 A1 | 4/2014 | Byrne | 439/638 |
| 2014/0117997 A1 | 5/2014 | Bertness | |
| 2014/0194084 A1 | 7/2014 | Noonan | 455/404.1 |
| 2014/0225622 A1 | 8/2014 | Kudo | 324/433 |
| 2014/0239964 A1 | 8/2014 | Gach | 324/433 |
| 2014/0260577 A1* | 9/2014 | Chinnadurai | G01R 31/34 73/114.59 |
| 2014/0266061 A1 | 9/2014 | Wachal | |
| 2014/0278159 A1* | 9/2014 | Chinnadurai | G01R 31/007 702/58 |
| 2014/0354237 A1 | 12/2014 | Cotton | |
| 2015/0093922 A1 | 4/2015 | Bosscher | 439/39 |
| 2015/0115720 A1 | 4/2015 | Hysell | 307/65 |
| 2015/0166518 A1 | 6/2015 | Boral et al. | |
| 2015/0168499 A1 | 6/2015 | Palmisano | |
| 2015/0221135 A1 | 8/2015 | Hill | 345/633 |
| 2016/0011271 A1 | 1/2016 | Bertness | |
| 2016/0091571 A1 | 3/2016 | Salo, III | |
| 2016/0154044 A1 | 6/2016 | Bertness | |
| 2016/0171799 A1 | 6/2016 | Bertness | |
| 2016/0216335 A1 | 7/2016 | Bertness | |
| 2016/0238667 A1 | 8/2016 | Palmisano et al. | |
| 2016/0253852 A1 | 9/2016 | Bertness et al. | |
| 2016/0266212 A1 | 9/2016 | Carlo | |
| 2016/0285284 A1 | 9/2016 | Matlapudi et al. | |
| 2016/0321897 A1 | 11/2016 | Lee | |
| 2016/0336623 A1 | 11/2016 | Nayar | |
| 2017/0093056 A1 | 3/2017 | Salo, III et al. | |
| 2017/0146602 A1* | 5/2017 | Samp | G01R 31/34 |
| 2017/0373410 A1 | 12/2017 | Lipkin et al. | |

(56) References Cited

U.S. PATENT DOCUMENTS

| | | | |
|---|---|---|---|
| 2018/0113171 | A1 | 4/2018 | Bertness |
| 2018/0306867 | A1 | 10/2018 | Bertness |

FOREIGN PATENT DOCUMENTS

| | | | |
|---|---|---|---|
| CN | 103091633 | | 5/2013 |
| DE | 29 26 716 | B1 | 1/1981 |
| DE | 40 07 883 | | 9/1991 |
| DE | 196 38 324 | | 9/1996 |
| DE | 10 2008 036 595 | A1 | 2/2010 |
| EP | 0 022 450 | A1 | 1/1981 |
| EP | 0 391 694 | A2 | 4/1990 |
| EP | 0 476 405 | A1 | 9/1991 |
| EP | 0 637 754 | A1 | 2/1995 |
| EP | 0 772 056 | A1 | 5/1997 |
| EP | 0 982 159 | A2 | 3/2000 |
| EP | 1 810 869 | A1 | 11/2004 |
| EP | 1 786 057 | | 5/2007 |
| EP | 1 807 710 | B1 | 7/2007 |
| EP | 1 807 710 | | 1/2010 |
| EP | 2 302 724 | | 3/2011 |
| FR | 2 749 397 | | 12/1997 |
| GB | 154 016 | | 11/1920 |
| GB | 2 029 586 | | 3/1980 |
| GB | 2 088 159 | A | 6/1982 |
| GB | 2 246 916 | A | 10/1990 |
| GB | 2 275 783 | A | 7/1994 |
| GB | 2 353 367 | | 2/2001 |
| GB | 2 387 235 | A | 10/2003 |
| JP | 59-17892 | | 1/1984 |
| JP | 59-17893 | | 1/1984 |
| JP | 59017894 | | 1/1984 |
| JP | 59215674 | | 12/1984 |
| JP | 60225078 | | 11/1985 |
| JP | 62-180284 | | 8/1987 |
| JP | 63027776 | | 2/1988 |
| JP | 03274479 | | 12/1991 |
| JP | 03282276 | | 12/1991 |
| JP | 4-8636 | | 1/1992 |
| JP | 04095788 | | 3/1992 |
| JP | 04131779 | | 5/1992 |
| JP | 04372536 | | 12/1992 |
| JP | 05211724 | A | 8/1993 |
| JP | 5216550 | | 8/1993 |
| JP | 7-128414 | | 5/1995 |
| JP | 09061505 | | 3/1997 |
| JP | 10056744 | | 2/1998 |
| JP | 10232273 | | 9/1998 |
| JP | 11103503 | A | 4/1999 |
| JP | 11-150809 | | 6/1999 |
| JP | 11-271409 | | 10/1999 |
| JP | 2001-023037 | | 1/2001 |
| JP | 2001057711 | A | 2/2001 |
| JP | 2003-346909 | | 12/2003 |
| JP | 2005-238969 | | 9/2005 |
| JP | 2006331976 | A | 12/2006 |
| JP | 2009-244166 | | 10/2009 |
| JP | 2009-261174 | | 11/2009 |
| JP | 2010-172122 | | 5/2010 |
| JP | 2010-172142 | | 8/2010 |
| RU | 2089015 | C1 | 8/1997 |
| WO | WO 93/22666 | | 11/1993 |
| WO | WO 94/05069 | | 3/1994 |
| WO | WO 96/01456 | | 1/1996 |
| WO | WO 96/06747 | | 3/1996 |
| WO | WO 96/28846 | | 9/1996 |
| WO | WO 97/01103 | | 1/1997 |
| WO | WO 97/44652 | | 11/1997 |
| WO | WO 98/04910 | | 2/1998 |
| WO | WO 98/21132 | | 5/1998 |
| WO | WO 98/58270 | | 12/1998 |
| WO | WO 99/23738 | | 5/1999 |
| WO | WO 99/56121 | | 11/1999 |
| WO | WO 00/16083 | | 3/2000 |
| WO | WO 00/62049 | | 10/2000 |
| WO | WO 00/67359 | | 11/2000 |
| WO | WO 01/59443 | | 2/2001 |
| WO | WO 01/16614 | | 3/2001 |
| WO | WO 01/16615 | | 3/2001 |
| WO | WO 01/51947 | | 7/2001 |
| WO | WO 03/047064 | A3 | 6/2003 |
| WO | WO 03/076960 | A1 | 9/2003 |
| WO | WO 2004/047215 | A1 | 6/2004 |
| WO | WO 2007/075403 | | 7/2007 |
| WO | WO 2009/004001 | | 1/2009 |
| WO | WO 2010/007681 | | 1/2010 |
| WO | WO 2010/035605 | | 4/2010 |
| WO | WO 2010/042517 | | 4/2010 |
| WO | WO 2011/153419 | | 12/2011 |
| WO | WO 2012/078921 | | 6/2012 |
| WO | WO 2013/070850 | | 5/2013 |

OTHER PUBLICATIONS

Office Action from European Patent Application No. 15 151 426.2-1801, dated Aug. 28, 2017, 2 pages.
"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard—Lead Acid Batteries for Automobiles", *Japanese Standards Association UDC*, 621.355.2:629.113.006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design a 60 Hz Notch Filter with the UAF42", Jan. 1994, AB-071, 1994.
National Semiconductor Corporation, "LMF90-4$^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powederdesigners.com/InforWeb.design_center/articles/DC-DC/converter.shtm, prior to Oct. 1, 2002.

(56) References Cited

OTHER PUBLICATIONS

"Notification of Transmittal of the International Search Report or the Declaration", PCT/US02/29461, filed Sep. 17, 2002 and dated Jan. 3, 2003.
"Notification of Transmittal of the International Search Report or the Declaration", PCT/US03/07546, filed Mar. 13, 2003 and dated Jul. 4, 2001.
"Notification of Transmittal of the International Search Report or the Declaration", PCT/US03/06577, filed Mar. 5, 2003 and dated Jul. 24, 2003.
"Notification of Transmittal of the International Search Report or the Declaration", PCT/US03/07837, filed Mar. 14, 2003 and dated Jul. 4, 2003.
"Improved Impedance Spectroscopy Technique for Status Determination of Production Li/SO$_2$ Batteries" Terrill Atwater et al., pp. 10-113, (1992).
"Notification of Transmittal of the International Search Report or the Declaration", PCT/US03/41561; Search Report completed Apr. 13, 2004, dated May 6, 2004.
"Notification of Transmittal of the International Search Report or the Declaration", PCT/US03/27696, filed Sep. 4, 2003 and dated Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2; dated Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and dated Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, date of document Jan. 28, 2005.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Examination Report" from the UK Patent Office for App. No. 0417678.0; dated Jan. 24, 2005.
Wikipedia Online Encyclopedia, INDUCTANCE, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, dated Sep. 16, 2011, 12 pages.
U.S. Appl. No. 60/387,912, filed Jun. 13, 2002 which is related to U.S. Pat. No. 7,089,127.

"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV Plus Battery Packs", by A. Paryani, *IEEE AES Systems Magazine*, Nov. 2000, pp. 21-24.
Search Report from PCT/US2011/047354, dated Nov. 11, 2011.

(56) References Cited

OTHER PUBLICATIONS

Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 112011102064.3 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Office Action from Japanese Patent Application No. 2015-014002, dated Jul. 19, 2016.
Notification of Transmittal of the International Search Report and the Written Opinion of the International Searching Authority from PCT/US2016/02696, dated Aug. 24, 2016.
Office Action from German Patent Application No. 10393251.8, dated Nov. 4, 2016, including English translation.
Office Action from German Patent Application No. 112011101892.4, dated Sep. 7, 2017.
Office Action from Japanese Patent Application No. 2017-026740, dated Jan. 9, 2018.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.
U.S. Appl. No. 12/697,485, filed Feb. 1, 2010, 36 pgs.
Office Action from Chinese Patent Application No. 201480066251.8, dated Dec. 13, 2018.

\* cited by examiner

ALTERNATOR TESTER

CROSS-REFERENCE TO RELATED APPLICATION

The present application is based on and claims the benefit of U.S. provisional patent application Ser. No. 62/107,648, filed Jan. 26, 2015 and U.S. provisional patent application Ser. No. 62/161,555, filed May 14, 2015, the contents of which are hereby incorporated by reference in their entirety.

BACKGROUND

The present invention relates to automotive vehicles. More specifically, the present invention relates to testing of alternators in such vehicles.

Automotive vehicles include a storage battery for operating electronics in the vehicle and using an electric starter to start the vehicle engine. A battery charging system includes an alternator which is coupled to the engine and is powered by the engine when the vehicle is running. The charging system is used to charge the storage battery when the vehicle is operating.

Many techniques have been developed for testing the battery and related systems of the vehicle. Example techniques that have been pioneered by Dr. Keith S. Champlin and Midtronics, Inc. are shown and described in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 2005; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009;

U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 60/587,232, filed Dec. 14, 2004, entitled CELLTRON ULTRA, U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60/694,199, filed Jun. 27, 2005, entitled GEL BATTERY CONDUCTANCE COMPENSATION; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 60/751,853, filed Dec. 20, 2005, entitled BATTERY MONITORING SYSTEM; U.S. Ser. No. 60/751,853, filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 60/847,064, filed Sep. 25, 2006, entitled STATIONARY BATTERY MONITORING ALGORITHMS; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 60/992,798, filed Dec. 6, 2007, entitled STORAGE BATTERY AND BATTERY TESTER; U.S. Ser. No. 61/061,848, filed Jun. 16, 2008, entitled KELVIN CLAMP FOR ELECTRONICALLY COUPLING TO A BATTERY CONTACT; U.S. Ser. No. 12/697,485, filed Feb. 1, 2010, entitled ELECTRONIC BATTERY TESTER; U.S. Ser. No. 12/712,456, filed Feb. 25, 2010, entitled METHOD AND APPARATUS FOR DETECTING CELL DETERIORATION IN AN ELECTROCHEMICAL CELL OR BATTERY; U.S. Ser. No. 61/311,485, filed Mar. 8, 2010, entitled BATTERY TESTER WITH DATABUS FOR COMMUNICATING WITH VEHICLE ELECTRICAL SYSTEM; U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; U.S. Ser. No. 12/769,911, filed Apr. 29, 2010, entitled STATIONARY BATTERY TESTER; U.S. Ser. No. 61/330,497, filed May 3, 2010, entitled MAGIC WAND WITH ADVANCED HARNESS DETECTION; U.S. Ser. No. 61/348,901, filed May 27, 2010, entitled ELECTRONIC BATTERY TESTER; U.S. Ser. No. 61/351,017, filed Jun. 3, 2010, entitled IMPROVED ELECTRIC VEHICLE AND HYBRID ELECTRIC VEHICLE BATTERY MODULE BALANCER; U.S. Ser. No. 12/818,290, filed Jun. 18, 2010, entitled BATTERY MAINTENANCE DEVICE WITH THERMAL BUFFER; U.S. Ser. No. 61/373,045, filed Aug. 12, 2010, entitled ELECTRONIC BATTERY TESTER FOR TESTING STATIONARY STORAGE BATTERY; U.S. Ser. No. 12/888,689, filed Sep. 23, 2010, entitled BATTERY TESTER FOR ELECTRIC VEHICLE; U.S. Ser. No. 61/411,162, filed Nov. 8, 2010, entitled ELECTRONIC BATTERY TESTER; U.S. Ser. No. 13/037,641, filed Mar. 1, 2011, entitled MONITOR FOR FRONT TERMINAL BATTERIES; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/152,711, filed Jun. 3, 2011, entitled BATTERY PACK MAINTENANCE FOR ELECTRIC VEHICLE; U.S. Ser. No. 61/558,088, filed Nov. 10, 2011, entitled BATTERY PACK TESTER; U.S. Ser. No. 13/357,306, filed Jan. 24, 2012, entitled STORAGE BATTERY AND BATTERY TESTER; U.S. Ser. No. 61/665,555, filed Jun. 28, 2012, entitled HYBRID AND ELECTRIC VEHICLE BATTERY MAINTENANCE DEVICE; U.S. Ser. No. 13/668,523, filed Nov. 5, 2012, entitled BATTERY TESTER FOR ELECTRIC VEHICLE; U.S. Ser. No. 13/672,186, filed Nov. 8, 2012, entitled BATTERY PACK TESTER; U.S. Ser. No. 61/777,360, filed Mar. 12, 2013, entitled DETERMINATION OF STARTING CURRENT IN AN AUTOMOTIVE VEHICLE; U.S. Ser. No. 61/777,392, filed Mar. 12, 2013, entitled DETERMINATION OF CABLE DROP DURING A STARTING EVENT IN AN AUTOMOTIVE VEHICLE; U.S. Ser. No. 13/827,128, filed Mar. 14, 2013, entitled HYBRID AND ELECTRIC VEHICLE BATTERY MAINTENANCE DEVICE; U.S. Ser. No. 61/789,189, filed Mar. 15, 2013, entitled CURRENT CLAMP WITH JAW CLOSURE DETECTION; U.S. Ser. No. 61/824,056, filed May 16, 2013, entitled BATTERY TESTING SYSTEM AND METHOD; U.S. Ser. No. 61/859,991, filed Jul. 30, 2013, entitled METHOD AND APPARATUS FOR MONITORING A PLURALITY OF STORAGE BATTERIES IN A STATIONARY BACK-UP POWER SYSTEM; U.S. Ser. No. 14/039,746, filed Sep. 27, 2013, entitled BATTERY PACK MAINTENANCE FOR ELECTRIC VEHICLE; U.S. Ser. No. 61/915,157, filed Dec. 12, 2013, entitled BATTERY TESTER AND BATTERY REGISTRATION TOOL; U.S. Ser. No. 61/928,167, filed Jan. 16, 2014, entitled BATTERY CLAMP WITH ENDOSKELETON DESIGN; U.S. Ser. No. 14/204,286, filed Mar. 11, 2014, entitled CURRENT CLAMP WITH JAW CLOSURE DETECTION; U.S. Ser. No. 14/276,276, filed May 13, 2014, entitled BATTERY TESTING SYSTEM AND METHOD; U.S. Ser. No. 62/024,037, filed Jul. 14, 2014, entitled COMBINATION SERVICE TOOL; U.S. Ser. No. 62/055,884, filed Sep. 26, 2014, entitled CABLE CONNECTOR FOR ELECTRONIC BATTERY TESTER; U.S. Ser. No. 14/565,689, filed Dec. 10, 2014, entitled BATTERY TESTER AND BATTERY REGISTRATION TOOL; U.S. Ser. No. 14/598,445, filed Jan. 16, 2015, entitled BATTERY CLAMP WITH ENDOSKELETON DESIGN; U.S. Ser. No. 62/107,648, filed Jan. 26, 2015, entitled ALTERNATOR TESTER; U.S. Ser. No. 62/137,491, filed Mar. 24, 2015, entitled BATTERY MAINTENANCE SYSTEM; U.S. Ser. No. 62/154,251, filed Apr. 29, 2015, entitled CALIBRATION AND PROGRAMMING OF IN-VEHICLE BATTERY SENSORS; U.S. Ser. No. 62/155,045, filed Apr. 30, 2015, entitled CALIBRATION AND PROGRAMMING OF IN-VEHICLE BATTERY SENSORS; U.S. Ser. No. 62/161,555, filed May 14, 2015, entitled ALTERNATOR TESTER, U.S. Ser. No. 14/799,120, filed Jul. 14, 2015, entitled AUTOMOTIVE MAINTENANCE SYSTEM; U.S. Ser. No. 14/861,027, filed Sep. 22, 2015, entitled CABLE CONNECTOR FOR ELECTRONIC BATTERY TESTER; U.S. Ser. No. 62/233,614, filed Sep. 28, 2015, entitled KELVIN CONNECTOR ADAPTOR FOR STORAGE BATTERY; all of which are incorporated herein by reference in their entireties.

With the advent of accurate battery testing, it has become apparent that in some instances the battery in the vehicle may be good, and a problem related to the battery charging system is the cause of the perceived battery failure. A vehicle charging system generally includes the battery, an alternator, a regulator and an alternator drive belt. The role of the charging system is two fold. First, the alternator provides charging current for the battery. This charging current ensures that the battery remains charged while the vehicle is being driven and therefore will have sufficient capacity to subsequently start the engine. Second, the alternator provides an output current to power all of the vehicle electrical loads. In general, the alternator output, the battery capacity, the starter draw and the vehicle electrical load requirements are matched to each other for optimal performance. In a properly functioning charging system, the alternator will be capable of outputting enough current to drive the vehicle electrical loads while simultaneously charging the battery. Typically, alternators range in size from 60 to 120 amps.

There is a significant problem in the automotive industry with alternators that are replaced and subsequently determined to be in working condition. With alternators, this problem is even more significant than in the case of a storage battery which is replaced unnecessarily. This is because alternators may be much more expensive as well as much more difficult to replace than a storage battery.

Further, removing of an alternator from a vehicle, testing the alternator itself may be problematic. The alternator may be designed to communicate with a control system of the vehicle. Further, the complete testing of the alternator requires application of electrical loads while also applying a mechanical input to the alternator.

The difficulty in testing an alternator may result in an unnecessary warranty claims, expenses to vehicle owners, and a failure to identify a failure in a vehicle charging system.

SUMMARY

An alternator tester is configured to test an alternator of a vehicle, the alternator of the type which electrically couples to the vehicle through an alternator connector. The alternator tester includes alternator test circuitry and an alternator test connector or adapter configured to electrically connect the test circuitry to the alternator connector. An optional vehicle connector is configured to electrically connect the test circuitry to the vehicle through the alternator connector. The test circuitry is configured to interact with the alternator through the alternator test connector and thereby test operation of the alternator. A configuration for testing an alternator out of a vehicle is also provided.

DETAILED DESCRIPTION OF ILLUSTRATIVE EMBODIMENTS

Figure 1:
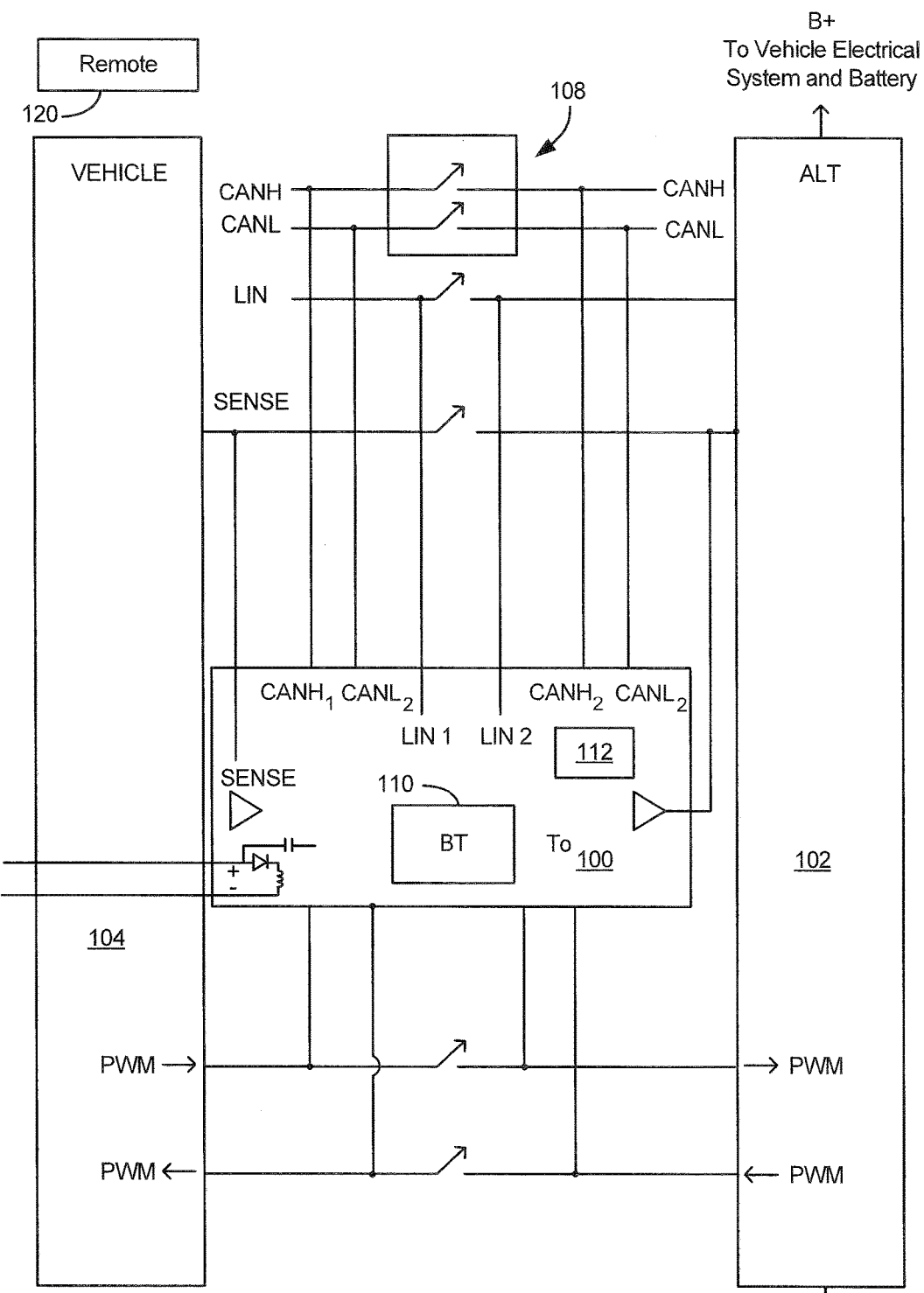
FIG. 1 is a simplified block diagram showing an alternator tester having an adapter plug electrically coupled between an alternator and other components of an automotive vehicle.

In various aspects, the present invention provides an alternator or starter motor tester which includes alternator test circuitry which is electrically coupled between an alternator and other components of an automotive vehicle. An optional clamp on amp meter (amp clamp) or other current sensor can be configured to electrically couple to an alternator output B+ cable. The clamp on amp meter can communicate wirelessly, for example through a Bluetooth® connection, to other equipment. Further, the tester can be configured to work with an alternator or starter motor that has been removed from a vehicle.

Alternators are used in automotive vehicles to provide power to the electrical system of the vehicle as well as charge a battery of the vehicle. There are many types of alternator configurations and they vary between vehicles as well as manufacturers. In general, an alternator has at least two outputs, a ground and a powered output which is sometimes referred to as the B+ connection. The alternator acts as an electrical generator and is typically rotated by an internal combustion engine in the vehicle. Other typical connections to an alternator include a connection to an ignition switch as well as connections for an external voltage regulator. Additionally, some alternators include an internal voltage regulator and/or diodes for rectifying an AC charge signal generated by the alternator. Further still, some more complex alternators may include internal sensors for use in diagnostics as well as a databus connection for coupling to a databus of a vehicle. Some alternators also include connections for connecting to external sensors such as a voltage or current sensor located proximate the vehicle battery. Similarly, starter motors in vehicles vary greatly in their configuration. A typical starter motor has at least two electrical connections, one to electrical ground and a switchable power connection used to power an electrical motor of the alternator and thereby crank the internal combustion engine of the vehicle. The power connection is typically controlled by an electrical relay connected to the key switch of the vehicle. Closing this relay completes an electrical circuit with the vehicle battery. Some starter motors include additional connections including connections to external sensors, connecting to internal sensors of the starter motor, and may even include a connection for coupling to a databus of the vehicle. The variability between various alternator and starter motor configurations makes it difficult to test the performance of more than one specific configuration.

A universal connector system may be implemented which includes one or more specific adapter cables that are configured to be plugged into particular vehicle types and/or alternator types. This allows the alternator test circuitry to be placed between the vehicle and the alternator to thereby monitor signals which are exchanged therebetween as well as send commands or other information over this connection. The cable can also be used to control and monitor operation of the alternator for bench (out of vehicle) testing.

The communication may occur using any appropriate technique including communicating with vehicle circuitry over an OBDII module. This allows the device to query the VIN number as well as other information from the vehicle including determining specifics vehicle type, control, RPM, particular loads of the vehicle, etc.

The alternator tester may also communicate with other equipment including a battery tester such as those in accordance with the various techniques set forth herein as well as a charger which can monitor battery voltage, apply loads, etc. The communication with the OBDII system may be directly or also may also be routed through the tester, etc.

FIG. 1 shows a simplified schematic diagram of an adapter cable 108 for use alternator tester 100 (shown in FIG. 2) connected between the alternator 102 and the vehicle 104. For example, the alternator and vehicle may be coupled together through electrical plugs or other connectors. These connections can be separated and the alternator tester plugged therebetween. This allows communication and control over the system through the various connectors including a sense connector, a pulse width modulated (PWM) connection, CAN, LIN, etc. The various physical connectors and communication protocols are chosen for a specific vehicle and alternator under test. Alternator 102 also includes a B+ connection which provides a charging output to the battery of the vehicle. A current sensor (not shown in FIG. 1) such as an amp clamp or other type of sensor, may be coupled to the B+ output or electrical ground and used to monitor the amount of current provided by the alternator 102 as well as the waveform of this current. Additionally, voltage sensors may also be employed.

In operation, a technician electrically couples the amp clamp to the alternator 102 B+ cable. The electrical connections/cables which extend between the alternator and the vehicle are unplugged and the technician plugs the adapter cable 108 of the alternator 104 into these connections. The alternator test circuitry 100 may more than monitor a communication that occurs between the vehicle 104 and the alternator 102 and simply pass signals therebetween. Such information and communication could include commands sent from the vehicle 104, particular responses or commands from the alternator 102, responses of the vehicle 104 to particular events or communications from the alternator 102, loading of the electrical system, changes in the RPM of a motor of the vehicle 104, etc. When used during bench testing, the cable 108 can be used to control operation of the alternator 102 as well as monitor its operation.

After observing communication between the alternator 102 and the vehicle 104 during normal operation, the test circuitry 100 may than break the electrical connection and insert itself into the communication. This allows the test circuitry 100 to operate as if it was the vehicle sending commands to the alternator and observing responses including changes in the charge signal from the alternator 102. Similarly, the test circuitry 100 may operate as if it was the alternator 102 sending and receiving commands and information from the vehicle 104 and observing such operation.

This allows a determination to be made as to the root cause of a problem. The cause of a charging problem may be isolated as between a problem within an alternator 102 itself, a problem related to the vehicle 104 including engine control or commands or other information communicated with the alternator 102, electrical wiring, sensed leads, etc. The use of an optional battery test may also be implemented to further isolate problems in the electrical system.

If Bluetooth® or other communication circuitry 110 is provided, a technician may be able to remotely monitor the test circuitry 100 or communicate with cable 108, including communicating with the adapter cable 108 while the technician operates the vehicle 104. The technician can communicate with the adapter cable using remote unit 120. The test circuitry and/or adapter cable 108 may also include a local input or output including a display or command buttons for use by the technician. Further, data collected during monitoring or testing may be logged in a memory 112 of the cable adapter 108 for subsequent examination.

The device 100 may optionally be coupled to the vehicle for long-term operation. For example, a customer may be instructed to use their vehicle 104 for the period of time with the cable adapter 10 monitoring operation and performing diagnostics.

The cable adapter 108 may include other communication circuitry as well as other sensors or sense circuitry as appropriate for the various vehicles 104 and/or alternators 102 which may be tested. An optional internal power supply may be used or the device may be powered with power received from the vehicle itself. A remote wireless display and/or input or other control 120 may be used to allow the operator to monitor and control the cable adapter 108 or the test circuitry 100. Collected information including test results, type of vehicle, VIN number, type of alternator, etc. may also be collected and communicated to a remote location such as a remote database, a manufacturer or warranty service location, etc.

The databus connections to the cable 110 can also be used to provide additional functionality. For example, a microprocessor or other logic may be added to the cable 108 by a user, for example in the field. This allows additional features or upgrades to be provided to the cable 108 after an initial sale or installation. In such a configuration, a module containing the additional functionality is coupled to the cable 108 and interfaced to the databus. This module may be powered internally, or may receive power from the cable 108 itself, including, for example, through a connection to the vehicle 104. Further, additional relay logic or other functionality including additional sensors, connectors for additional communications, etc. may be provided.

The alternator tester system 100 discussed herein may also be configured to function and test an alternator which has been removed from a vehicle. In such a configuration, the alternator tester 100 includes a motor or other actuator to rotate the alternator causing the alternator to function. In such a configuration, the vehicle interface discussed above is not required. The alternator tester may include a storage battery or a load configured to simulate a storage battery for performing diagnostics. In such a configuration, the battery itself may also be tested using the techniques discussed herein.

A universal drive system may be provided in which a groove/V-belt is configured to couple to the alternator and cause the alternator to be rotated. An arrangement is provided in which an alternator is mounted in a test fixture, a belt connected to the alternator, and the belt tension so that the alternator is caused to rotate by movement of the belt. This configuration can be held in place on the pulley of a motor by belt tensioners or the like. The alternator can be placed in a linear actuator that can be configured to lift or otherwise move the alternator with respect to the motor pulley on the drive belt to thereby tension the drive belt. A strap or other attachment mechanism can be used to fasten the alternator to the linear actuator on a temporary basis. A lifting lever or the like applies compression against the cost rate spring to the linear actuator to thereby take up slack and provide belt tension. Variations in travel due to different sized alternators can then be absorbed by the springs. The locking and positioning of the alternator 102 within the tester 100 can be performed manually by an operator, or may be performed automatically by the tester 100.

The alternator, belt and drive pulley can be enclosed in an enclosure for safety purposes. The enclosure may include safety cover with a window and include mechanical interlocks that can be pulled over the device. The safety cover can also latch the lifting lever into place to thereby ensure belt tension during testing. Optional lifting mechanisms may be employed to accommodate different alternator configurations.

A selectable electrical load can be applied to the alternator during testing. For example, 5, 10, 15 and 20 amp load currents can be drawn from the alternator and using resistive loads that are digitally actuated and combined in various combinations to achieve loads which draw from between 5 amps up to 50 amps. A motor can be powered by standard wall current for example, 115 VAC such as a 1.5 hp motor, which is used to power the alternator up to its maximum output. The motor can include a start capacitor for assisting in startup. The amp clamp discussed above can be used with a B+ output from the alternator passing through a wire and to the load. The amp clamp can be placed around the wire to monitor current flow. In one configuration, the B+ and grounding cables are implemented with low cost weld connectors. A separate or integral battery tester can also be employed. In one configuration, the battery tester docks with the alternator base to perform battery testing and communicate with internal control circuits in the tester 100. Wireless communication may also be implemented. The alternator tester 100 may also provide other communication techniques including WiFi, Ethernet, Bluetooth™, cellular, etc. Specific cables may be employed for specific types of alternators and may include identification information stored either visually and/or using other techniques such as RFID or NFC tags or using other storage techniques. Similarly, a memory or the like may be used to store information in the cable connector, including resistors which can be programmed as desired. The alternator tester may include an optional output such as a video display screen to show connection diagrams, instructions videos, test results, etc. The information may be stored in memory or provided live from an external source such as the internet, data cloud, etc.

Figure 2:
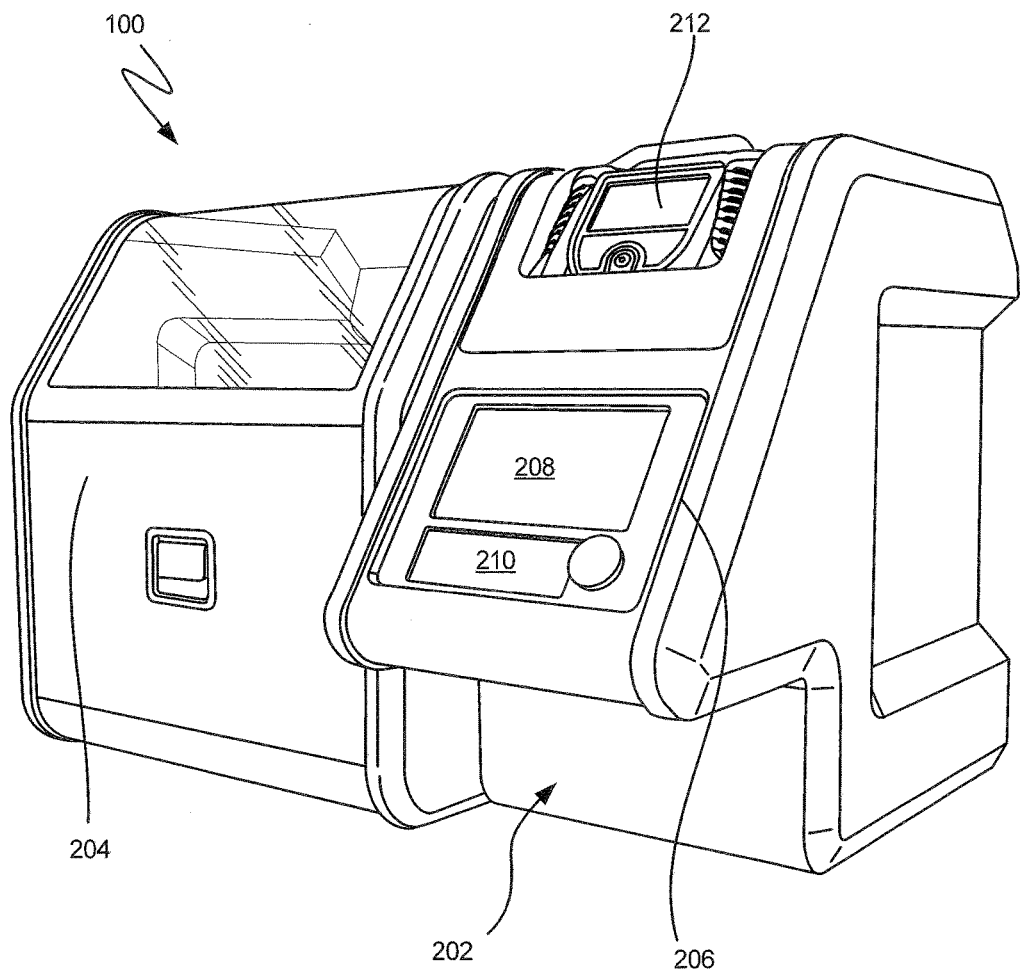
FIG. 2 is a perspective view of an alternator tester in accordance with one example configuration.
Figure 3:
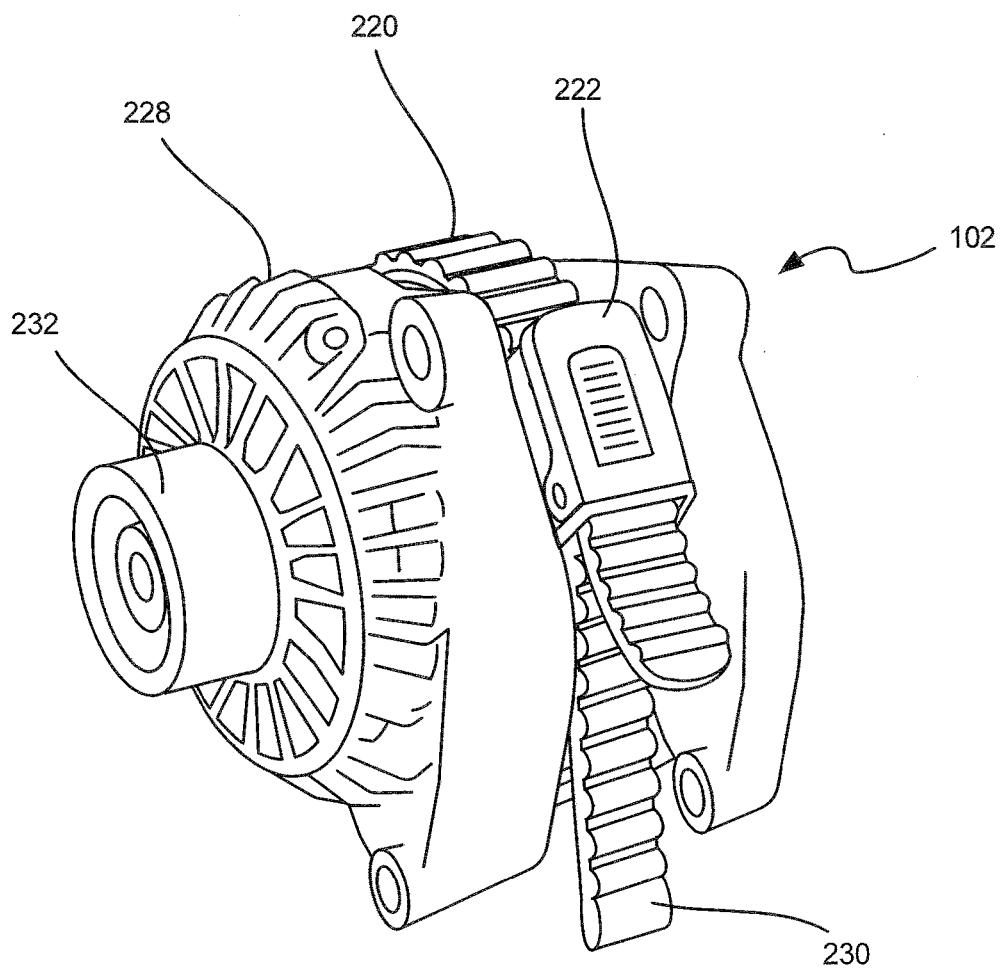
FIG. 3 is a perspective view of an alternator secured by a belt.

FIG. 2 is a perspective view showing alternator tester 100 including a base 202 and a protective cover 204. The alternator 102 may be mounted on the base 202 at an operator protected during operation by protective cover 204. FIG. 2 also shows an input/output counsel 206 including a display 208 and a manual input such as a keypad 210. A battery tester 212 is also illustrated as mounted in the base 202. FIG. 3 is a perspective view showing alternator 102 mounted within the base 202 and secured by a mounting strap 220 having an adjustable buckle 222. As illustrated in FIG. 3, alternator 102 includes an alternator body 228 and mounting apertures 230. Mounting apertures 230 are configured to be mounted using bolts or the like to the engine of the vehicle. The alternator 102 also includes a pulley 232 arranged to couple to a drive belt in the vehicle. In one configuration, the mounting strap 220 and adjustable buckle are configured to manually or automatically clamp and secure the alternator 102. For example, a drive motor or other actuator may be connected to the belt 220 to apply the desired tension. Additionally, a rubber mount or other compliant component can be arranged to support the base of the alternator.

Figure 4:
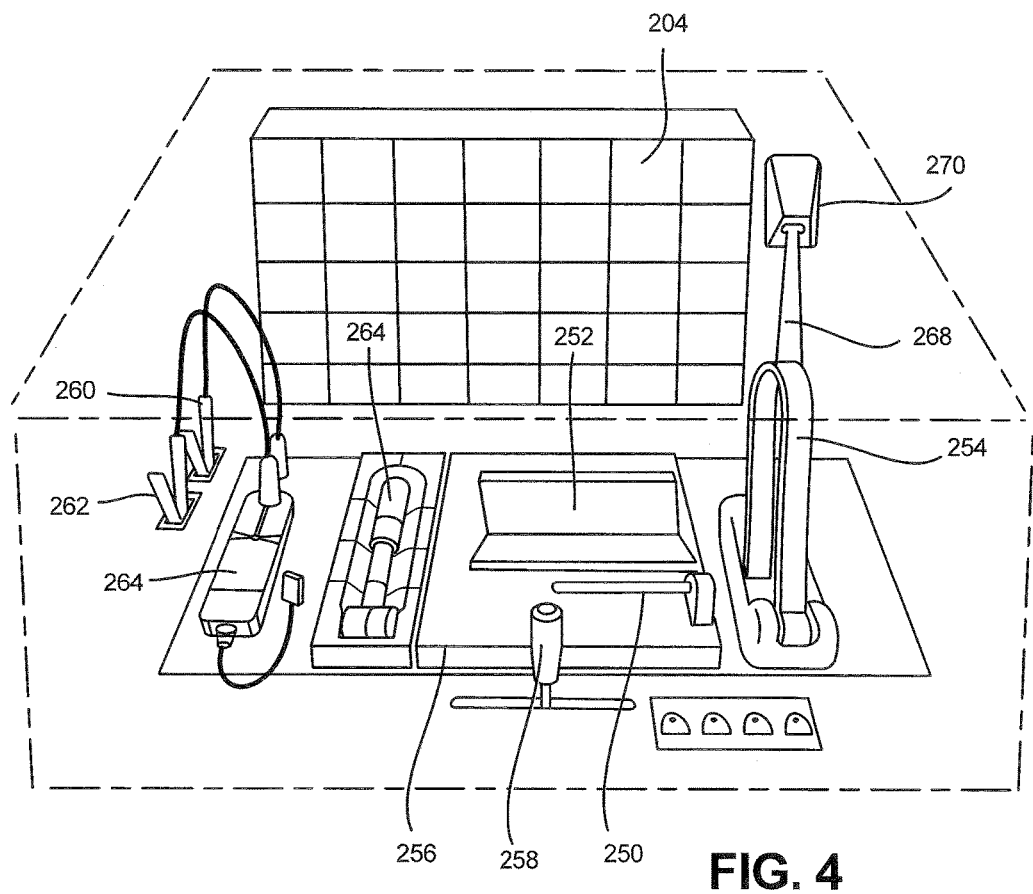
FIG. 4 is a top perspective view of the alternator tester of FIG. 2 in which a perspective cover is opened.
Figure 5:
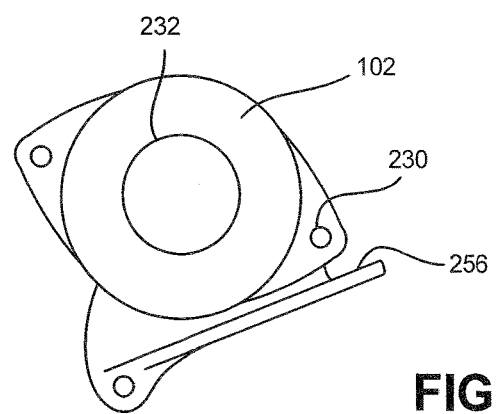
FIG. 5 is a side plan view of an alternator mounted in the alternator tester of FIG. 4.

FIG. 4 is a view of the tester 100 with the lid 204 opened. As illustrated in FIG. 4, a shaft 250 is arranged to be received through the mounting apertures 230 of the alternator 102. The alternator body 228 rests in a support 252 and a drive belt 254 is placed around the pulley 232. The support 252 and shaft 250 are carried on a support plate 256 which can be adjusted laterally with respect to the belt 254 using horizontal actuator handle 258. Probe clips 260 and 262 are provided and can be used, for example, to connect to the ground and B+ connection of the alternator 102. An amp clamp 264 may also be provided for measuring current flow. A vertical actuator handle 264 is provided and arranged to raise the support plate 256 as illustrated in FIG. 5. Prior to testing, the alternator 102 is raised using actuator handle 264 whereby the pulley 232 is tightly pressed against the drive belt 254.

Figure 6:
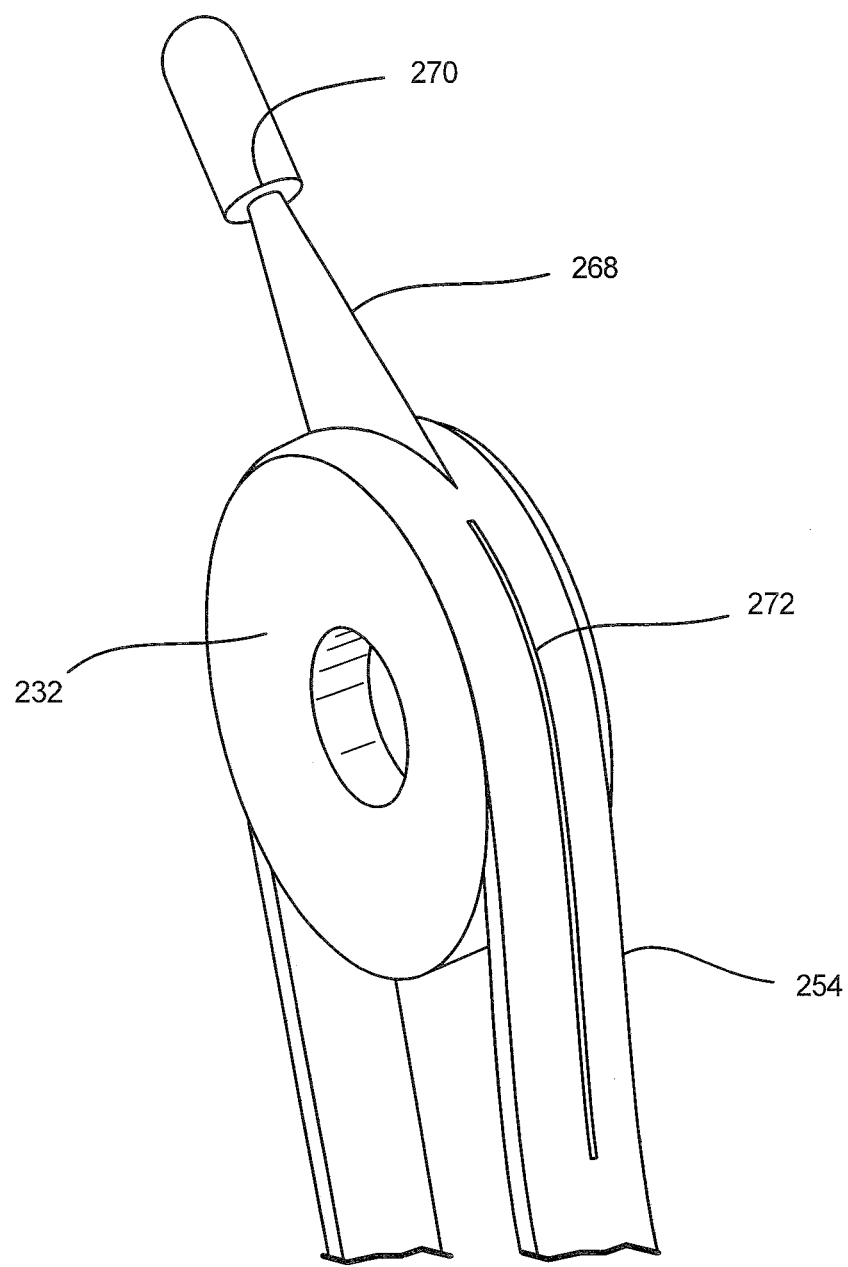
FIG. 6 illustrates a laser to align a belt.

As illustrated in FIG. 4, a laser light source 270 is provided and arranged to project a linear beam 268 onto the drive belt 254. As illustrated in FIG. 6, the drive belt 254 includes an alignment mark 272. The horizontal actuator handle 258 can be used to move the alternator 102 horizontally whereby the alignment mark 272 is brought into alignment with the linear beam 268. This ensures that the alternator 102 can be operated at high speed without any lateral offset with between the alternator pulley and the belt 254.

Figure 7:
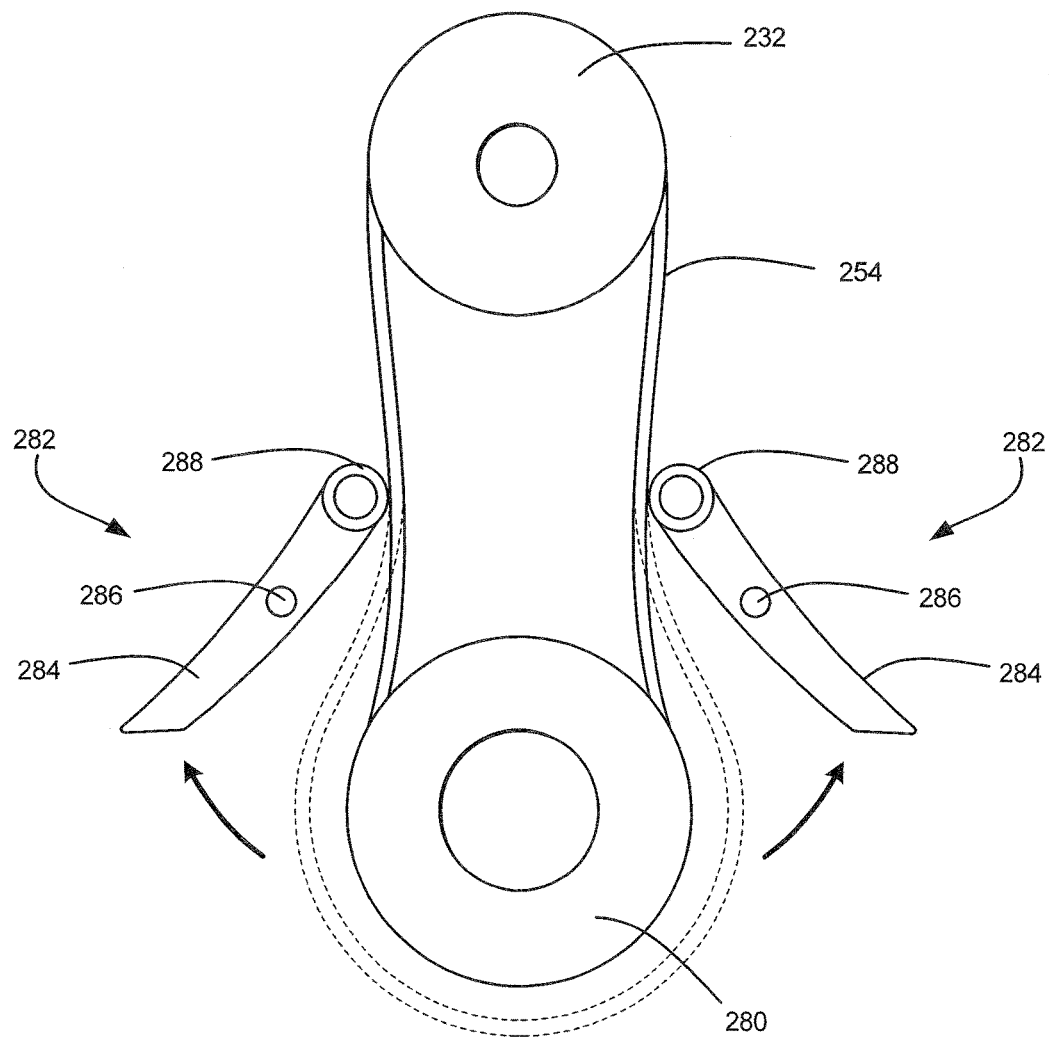
FIG. 7 is a side plan view illustrating belt tensioners used to tension a belt used to drive an alternator.

As illustrated in FIG. 7, the drive belt 254 is driven by a drive wheel 280 within the tester 100. A tensioning mechanism 282 is provided in which armatures 284 rotate about pivots 286 to apply a desired tension to the belt 254 through rollers 288. The tensioning mechanism 282 may be driven manually by an operator or the tester 100 may automatically actuate the tensioners 282 to provide the desired tension. A linear actuator, rotary gear motor, or the like may be employed to actuate the tensioning mechanism 282. The appropriate tension level can be determined by, for example, by monitoring the voltage or current output from the alternator 102 as well as monitoring the amount of torque required to rotate the drive wheel 280.

Figure 8:
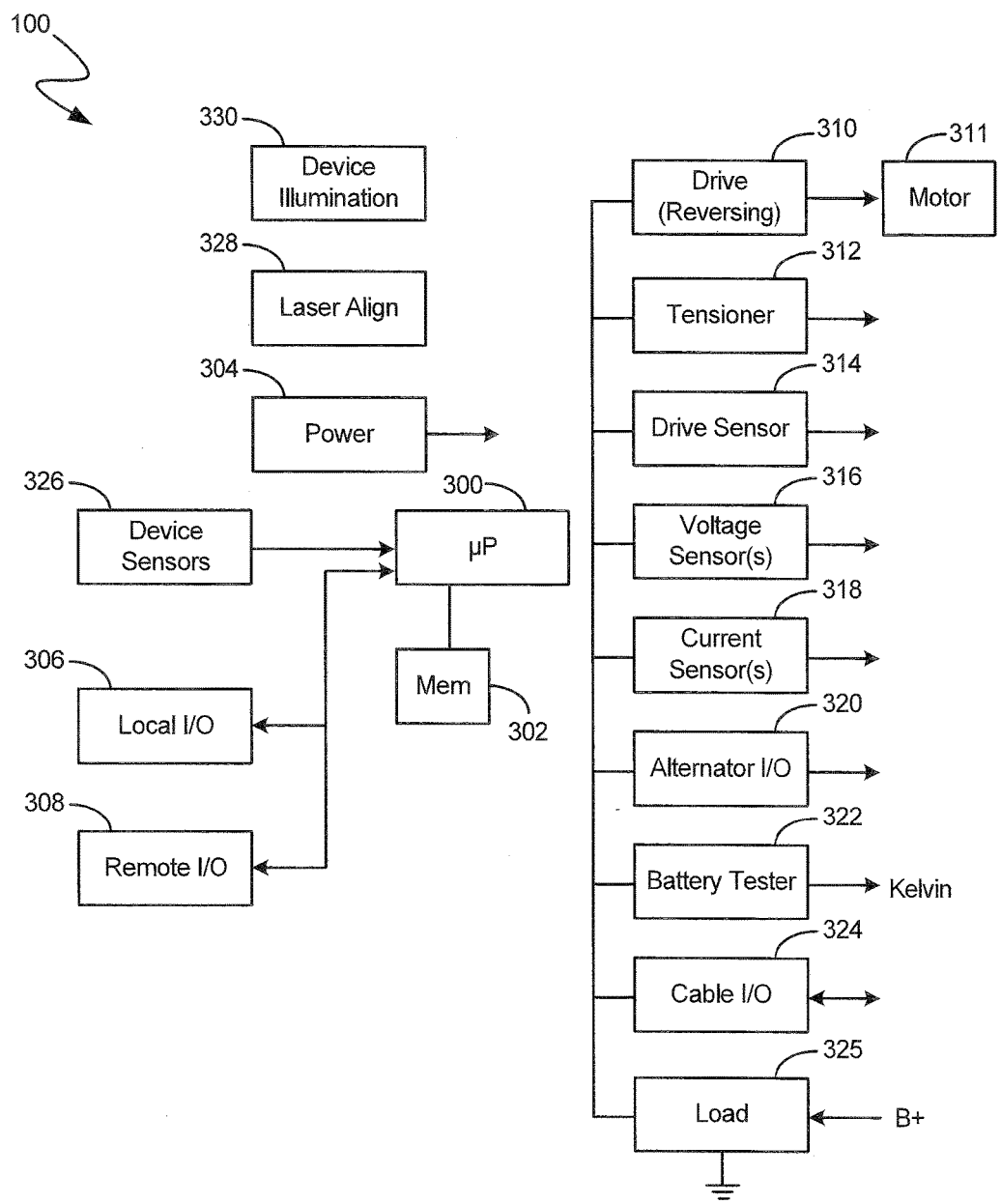
FIG. 8 is a simplified block diagram of an alternator in accordance with one example embodiment.

FIG. 8 is a simplified block diagram of alternator tester 100 showing various components of the system. Alternator tester 100 includes a microprocessor 300 or other controller which operates in accordance with instructions stored in a memory 302. Memory 302 can also be used to store other information including information regarding the alternator under test, test criteria, test rules, test measurements, test results, information related to an operator or a location, instructions which may be provided to an operator, etc. Test system 100 also includes a power supply 304 used to power the various components of the device. A local I/O 306 is provided and may comprise, for example, a user output such as a display as well as a user input such as a keyboard, touchpad, touchscreen, etc. The local I/O may also include other types of input/output circuitry including a barcode scanner, local Bluetooth® communication circuitry, RF communication circuitry, etc. Remote I/O circuitry 304 is also provided as a way to communicate with the remote location using wireless or wired communication protocols including, for example, WiFi, Ethernet, cellular technologies, etc. as well as the remote user interface 120 shown in FIG. 1.

The system 100 includes any number modules for sensing and/or controlling various aspects of the testing procedure. A drive circuit 310 is used to drive a motor 311 which turns the drive wheel 280. The motor 311 can be a capacitor start/capacitor run motor in order to provide for maximum horsepower using power from a standard AC outlet. The drive wheel 280 may be driven at different speeds as well as optionally reversed in accordance with some alternator configurations, such as clutched alternators. A tensioner actuator 312 is provided. A drive sensor 314 can be used to sense the amount of resistance applied by the drive motor 311. This can be used as feedback for tensioning the drive belt using tensioner actuator 312 as well as use to identify problems with a particular alternator such as a failing bearing. Voltage sensors 316 are used for connecting to various voltage points in the alternator such as the B+ connection, ground connection, control connections, etc. Current sensors 318 may also be provided and may include the amp clamp discussed herein. The current sensors may be Hall Effect sensors, amp clamp sensors, as well as shunt based sensors or other configurations. Alternator I/O circuitry 320 is provided for use in sending control signals to the alternator 102 as well as sensing output data provided by the alternator. An optional battery tester 322 may be provided for connecting to a battery of the vehicle. The battery tester 322 may include Kelvin connections for use in measuring a dynamic parameter of the battery or other components of the vehicle. A cable I/O module 324 may be provided to communicate with a cable, such as cable 108 shown in FIG. 1. The cable is used to provide the data and sensor connections to the alternator. Various different cables may be employed and the cable I/O module 324 is used to interrogate the cables to identify the particular cable which is in use as well as any information stored in the cable. Additionally, information may be sent to a memory in the cable for storage and subsequent use. Various modules illustrated in FIG. 8 maybe embodied in cable 108. Further, the modules may be used in interface with an alternator and a vehicle while the alternator is in the vehicle, and may also be used in configurations in which the alternator is removed from the vehicle for bench testing.

The drive belt 254 shown in FIG. 4 can include a v-groove or other universal groove which is capable of driving many types of different alternators. The tensioners 282 may be driven by in a linear manner using a linear actuator or through using a rotary gear technique, or other manner. An over traveled spring can be provided to assist in applying the desired tension. The tensioners 282 may be controlled using an over travel spring. Further, using the drive sensor 314, the motor 311 current and/or voltage may be monitored and used as a feedback mechanism. The current applied to motor 311 may be monitored and used as feedback mechanism to control the tensioning. A load 325 may be connected to the current output from the alternator 102, for example, between the B+ and ground connections, in order to load the alternator. The load may be controlled by microprocessor and may be variable whereby different loads may be applied to the alternator 102 and performance of the alternator monitored.

The memory 112 of cable 108 may store various types of information related to the cable itself. For example, the information may indicate a type of cable, a serial number of the cable, a date the cable was placed into service, the number of tests performed using the cable, statistics related to tests performed using the particular cable such as pass, fail, etc., or other information. A cable may be identified using data stored in a memory such as an EEPROM, a RFID chip or other type of communication device, a flash memory, a mechanical switch which may be set, programmable resistors, etc. Further, the cable can be left connected to a vehicle so that data can be collected during normal operation. Additionally, circuitry within the cable 108 can be used to perform soft diagnostics. For example, dual leads may be used to for an in vehicle testing configuration of the cable 108. In such a configuration, the normal communication between the vehicle and the alternator can be monitored as-is, or can be interrupted for detailed diagnostics. In the as-is mode, the tester can observe the command and response as provided by the vehicle. In the interrupted mode, the tester can pretend to be the alternator performing in different modes, and observing the vehicle response to verify correct operation. Alternatively, the tester can pretend to be the vehicle operating in different modes, and observe the alternator response to verify correct operation. With a single lead version, biased terminals can be provided for connector and alternator since it can be automatically detected if the correct loading is placed on the electrical terminals when the connector is fitted to the alternator. The various data buses provided by cable 108 illustrated in FIG. 1 may be used to add an additional microprocessor or providing additional functionality at a future date. Similarly, relay logic may be implemented.

During a bench test, an operator mounts alternator 102 in tester 100. The drive belt 254 is placed on pulley 232, aligned using laser 270, and tensioned using tensioners 282. Voltage sense connections are coupled to the B+ ground, or other connections to the alternator 102. Current sensors are used to sense the current generated by alternator 102 and control connections are provided for use in controlling operation of alternator 102. The alternator 102 is rotated using motor 311 and the output current and voltage are monitored. Various electrical loads are applied using load 325. The rate of rotation can be controlled as desired. A determination is made as to the condition of the alternator based upon the speed of rotation, the measured voltage and/or current, and the specifications of the alternation under test. These specifications may be input manually, stored in a database and selected based up on information received to identify the type of alternator under test or received using some other means. Data may also be received through a connection to a databus of the vehicle, for example using OBDII or some other technique. For example, when a certain resistive load is connected to alternator 102, and the alternator rotated at a particular RPM, the alternator 102 may be specified to output a minimum current and/or or voltage level. Further, the waveform of the current and/or voltage can be monitored, including monitoring under various speeds or loads, to ensure that there are no ambiguities such as excessive ripple. The torque required to rotate the alternator can also be measured to ensure that there are no mechanical problems with the alternator. Electrical parameters of the alternator 102 can also be measured, for example resistance, inductance, capacitance, or others, using the connections, including using the Kelvin connections provided by the batter tester module 322 or some other sensor. Based upon the measurements, a diagnostic output is provided, for example to an operator. The output can provide absolute measurements as well qualitative results such as pass, fail, or impending failure. The information may also be sent to a remote location using the techniques discussed herein.

During an in-vehicle test, the cable 108 is coupled between the vehicle 104 and the alternator 102 as illustrated in FIG. 1. Using the connections to the alternator, current and/or voltage generated by the alternator can be measured. Information related to alternator RPM can be retrieved from the vehicle databus. Further, the vehicle databus can be used to control loads applied to the alternator through the vehicle electrical system. The remote 120 can be used by an operator to communicate with the cable 108, including receiving data collected by the cable 108 and controlling the vehicle using a connection to the vehicle databus. The diagnostics and modules discussed above can be implemented in the cable. In another configuration, memory 112 in the cable 108 is used to store collected information for subsequent use in performing diagnostics. These may be performed using a computer, or other device such as tester 100. Further, if the cable can communicate information to a remote location, for example using a cellular data connection.

This configuration can also be used to test starters. For example, a starter can be mounted in the lift mechanism and a power supply used to provide energy to the starter motor. The output torque provided by the started can be measured using the belt 254 to drive a generator or the like, Further, if the power supply used to power the starter is sufficiently filtered, any ripple measured on the starter motor can be identified as being due to the starter itself and not from an external source.

Various aspects of configurations of the present invention are discussed herein and further identified below:
Electronic Battery Tester
Advanced Battery Diagnostics
Conductance Profiling
   for newer vehicles with advanced electrical systems
Communication Channels
Base/Gateway Channel
   Bluetooth LE
      Pathway to the cloud for test data and updates
Diagnostic Clamp Channel
   Bluetooth LE
      Simplified tangle-free connection to vehicle touch points
OBDII Channel
   Bluetooth LE
      Simplified connection to vehicle networks
Dynamic Customer Experience
TFT Color Screen
   High resolution display for graphical user interface
Strong glass
   Most robust system for workshop application
Capacitive Multi-Touch
   Enables intuitive user interface
Vehicle Identification
Bar Code Scanning (1D and 2D)
   Future proof system concept
   Automatically obtains VIN
      Used to tie service records to tests
      Identifies system specifications
Battery Registration
Required for certain newer vehicle battery replacement
Battery Reset Database
User guide to restore vehicle settings following battery replacement
Combined or split operation
Control module can be remotely used
In or Out of Vehicle Testing
Consistent, repeatable results
Charger Base/Gateway:
Communication Channels
Battery Tester
   Bluetooth LE uplink connection point
Cloud
   Options
      Ethernet
      Wi-Fi
      Cellular Modem
      Future proof with plug-in USB adapters
Data Flash Storage Standard
Upgradeable
Automatic charging of battery tester
Motor Drive:
Capacitor Start, Capacitor Run
Maximum amps at desired voltage
   Current sensing on AC line input
Reversing motor drive
   Compatible for CW/CCW alternators
Alternator Loads:
Digital Loads
5, 10, 15, 20 amp discrete loads
   Loading in 5 amp increments from 5 amps to 50 amps
      Enables appropriate current for each alternator type
Starter Power Supply
Low-ripple regulated supply
Ensures data represents starter condition
Positioner/Tensioner Simple lever actuation
Quick and easy alignment
Universal belt system
Works with serpentine pulleys
Works with V-belt pulleys
Spring-loaded over-travel
Maintains correct belt tension regardless of alternator size or position
Laser belt centering guide
Instructional Photos/Videos Displayed to Operator
TFT Color
Content Source
Flash Based
Cloud Based
Diagnostic Clamp
Bluetooth LE wireless connectivity
Alternator B+ current measurement
Automatically recharges when parked in base
Auxiliary voltmeter
Connects to alternator communication and vehicle
Isolates alternator for pinpoint diagnostics
Isolates vehicle for pinpoint diagnostics
Isolates battery for pinpoint diagnostics
Verifies total system performance
OBDII Connection Module
OBDII connectivity
Captures VIN
Captures relevant specifications
Monitors engine RPM
Monitors relevant DTCs
Control Cable Interface
Alternator Specific
Error Proofing
Digital Tag Verification
Diagnostic Clamp Connector
cycle rated
Alternator Connector
Cycle rating per alternator connector specification
   Optionally can custom tool high cycle design
      Consider for high usage cables
Dual Mode Cables
In Vehicle
Out of Vehicle
Future-proof
Unforeseen alternator interfaces
   Microcontroller and specific interfaces can be embedded in new cable type
Power Cable Interface
High Current Welding Connector
Unlimited cycle life
Automatically captures B+ current
Safety Systems
Simple to use
High visibility
Lighted interior
Mechanical and electrical safety interlocks
Emergency Stop Button
Cable Storage
Smart Storage Cabinet
Individual cable pockets
LED indicator for cable selection
Magnet retention lock The remote I/O circuitry 308 can be used for wireless communication with the test device 100. For example, a wireless diagnostic interface can be provided using remote 120 shown in FIG. 1 for in-vehicle testing. In such a configuration, an operator can connect the device to the alternator (or starter) and enter the vehicle to operate the vehicle. Monitoring of the device 100 can be provided using the remote 120. Such a configuration can also be used when bench testing a component using the arrangement illustrated in FIG. 4.

In one configuration, different types of cables 108 are stored within the device 100 for use in connecting to different types of alternators. For example, various cables may be stored in the compartments of protective cover 204 illustrated in FIG. 4. The system can identify particular cables for use by an operator by illuminating that cable (or compartment) as desired. An interior cabinet light may also be provided for operator convenience.

In one configuration, local I/O 306 provides a communication interface for an OBDII interface for interfacing with a vehicle under test. Such an interface can be used to monitor engine RPM, control the speed of the vehicle engine, monitoring an optional clearing diagnostic trouble codes (DTC), registering or identifying a particular alternator or starter motor in the vehicle, as well as vehicle identification. By identifying a particular vehicle, information related to the service requirements for that vehicle may be identified as well as relevant testing parameters or other information.

Although the present invention has been described with reference to preferred embodiments, workers skilled in the art will recognize that changes may be made in form and detail without departing from the spirit and scope of the invention. Although element 102 has been described above as an alternator, in one configuration element 102 is a starter motor of a vehicle whereby the test circuitry can be used to operation of the starter motor. In such a configuration, the test may be performed in-vehicle without removing the starter as well as out of vehicle. For example, the belt 254 can be used to apply a mechanical load to the starter and measure the torque provided by the starter motor. The various components discussed herein can be replaceable modulates such that they can be added as features to the system 100, or easily repaired/replaced as needed. Examples include the motor assembly, belt tensioner, controller, user interface, cabinet electronics, starter power supply, etc. As used herein, the term "alternator connector" refers to one or more of the electrical connections to an alternator including the connections which are used to provide an electrical output from the alternator as well as other connections including control connections and databus connections. Similarly, a starter motor connector includes one or more of the electrical connections used to power a starter motor, control a starter motor, or communicate with a starter motor. A capacitor start/capacitor run motor configuration for use in rotating the alternator ensures that maximum horse power is available on a standard AC outlet. Further, the term "alternator test connector" or "alternator test adapter" refers to the cable discussed herein. In one configuration, the same remote control unit can be used for performing bench testing as well as for in-vehicle testing. This allows for a consistent/uniform testing protocol to be applied in various settings for more consistent test results. Further diagnostics can be performed by connecting the adapter cable to a loop back connection ensuring that a voltage is detected or that there is continuity therebetween. In a single lead configuration, the lead can be biased, for example to six volts and connected to an alternator. Depending upon the connection, the six volt bias will be pulled high or low (for example to 12 volts or to electrical ground) when connected to the alternator thereby indicating continuity.

What is claimed is:

1. An alternator tester configured to test an alternator of a vehicle, the alternator of the type which electrically couples to the vehicle through an alternator connector, the alternator tester comprising:
   alternator test circuitry;
   an alternator test connector configured to electrically connect the test circuitry to the alternator connector;
   a vehicle connector configured to connect to an electrical connection of the vehicle, wherein the electrical connection comprises a databus of the vehicle and the vehicle connector is between the vehicle and the alternator such that the alternator test circuitry can monitor communication between the alternator and the databus of the vehicle; and
   wherein the test circuitry is configured to interact with the alternator through the alternator test connector and thereby test operation of the alternator.

2. The alternator tester of claim 1 including an amp clamp configured to couple to an alternator output B+ cable.

3. The alternator tester of claim 1 wherein the databus comprises an OBDII databus.

4. The alternator tester of claim 1 wherein the vehicle connector interrupts a connection between the vehicle and the alternator.

5. The alternator tester of claim 1 wherein the alternator test circuitry monitors communication between the vehicle and the alternator.

6. The alternator tester of claim 1 wherein components of the tester are modular.

7. The alternator tester of claim 1 wherein the alternator test circuitry is configured to identify an improper alternator test connector coupled to the alternator.

8. The alternator tester of claim 1 including a light configured to illuminate the alternator tester to assist an operator.

9. The alternator tester of claim 1 wherein the alternator test circuitry is further configured to test a starter motor.

10. The alternator tester of claim 1 including a load configured to electrically connect to the alternator and apply an electrical load to the alternator.

11. The alternator tester of claim 10 wherein the load comprises a variable load for drawing selectable current from the alternator.

12. The alternator tester of claim 1 including wireless communication circuitry.

13. The alternator tester of claim 12 wherein the wireless communication circuitry is used to wirelessly communicate with a remote unit.

14. The alternator tester of claim 1 including a connector configured to couple to a databus of a vehicle, the connector for use in at least one of monitoring engine RPM, controlling engine speed, monitoring diagnostic codes, clearing diagnostic codes, identifying an alternator and identifying a vehicle.

15. The alternator tester of claim 14 wherein an identified vehicle is used by the alternator test circuitry to identify specific service requirements of an alternator.

16. The alternator tester of claim 14 wherein the identified vehicle is used by the alternator test circuitry to identify test parameters for use in testing an alternator.

17. The alternator tester of claim 1 including a drive motor configured to drive the alternator.

18. The alternator tester of claim 17 wherein the drive motor is reversible.

19. The alternator tester of claim 17 including a strap configured to secure the alternator.

20. The alternator tester of claim 17 wherein the drive motor is connected to an alternator through a belt.

21. The alternator tester of claim 20 including a tensioner configured to apply tension to the belt.

22. The alternator tester of claim 20 including a laser for use in aligning the belt.

* * * * *